United States Patent
Lin et al.

(10) Patent No.: US 12,265,322 B2
(45) Date of Patent: *Apr. 1, 2025

(54) EUV MASK BLANK AND METHOD OF MAKING EUV MASK BLANK

(71) Applicant: Taiwan Semiconductor Manufacturing Co., Ltd., Hsinchu (TW)

(72) Inventors: Ping-Hsun Lin, Hsinchu (TW); Pei-Cheng Hsu, Hsinchu (TW); Ching-Fang Yu, Hsinchu (TW); Ta-Cheng Lien, Hsinchu (TW); Chia-Jen Chen, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,757

(22) Filed: Aug. 4, 2023

(65) Prior Publication Data

US 2023/0375911 A1    Nov. 23, 2023

Related U.S. Application Data

(63) Continuation of application No. 17/481,673, filed on Sep. 22, 2021, now Pat. No. 11,815,804.

(60) Provisional application No. 63/178,436, filed on Apr. 22, 2021.

(51) Int. Cl.
*G03F 1/24* (2012.01)

(52) U.S. Cl.
CPC .................................... *G03F 1/24* (2013.01)

(58) Field of Classification Search
CPC ........................................................ G03F 1/24
USPC ............................................................ 430/5
See application file for complete search history.

(56) References Cited

U.S. PATENT DOCUMENTS

| 11,815,804 B2* | 11/2023 | Lin .......................... G03F 1/52 |
| 2021/0109438 A1 | 4/2021 | Nasalevich et al. |

FOREIGN PATENT DOCUMENTS

| CN | 102640021 A | 8/2012 |
| CN | 102687071 A | 9/2012 |
| CN | 107452602 A | 12/2017 |
| CN | 112445058 A | 3/2021 |
| TW | 1289725 B | 11/2007 |
| TW | 1671545 B | 9/2019 |
| TW | 202111420 A | 3/2021 |
| TW | 202115273 A | 4/2021 |

* cited by examiner

*Primary Examiner* — Christopher G Young
(74) *Attorney, Agent, or Firm* — Seed IP Law Group

(57) ABSTRACT

An extreme ultraviolet mask including a substrate, a reflective multilayer stack on the substrate and a capping layer on the reflective multilayer stack is provided. The reflective multilayer stack is treated prior to formation of the capping layer on the reflective multilayer stack. The capping layer is formed by an ion-assisted ion beam deposition or an ion-assisted sputtering process.

20 Claims, 28 Drawing Sheets

EUV MASK BLANK AND METHOD OF MAKING EUV MASK BLANK

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
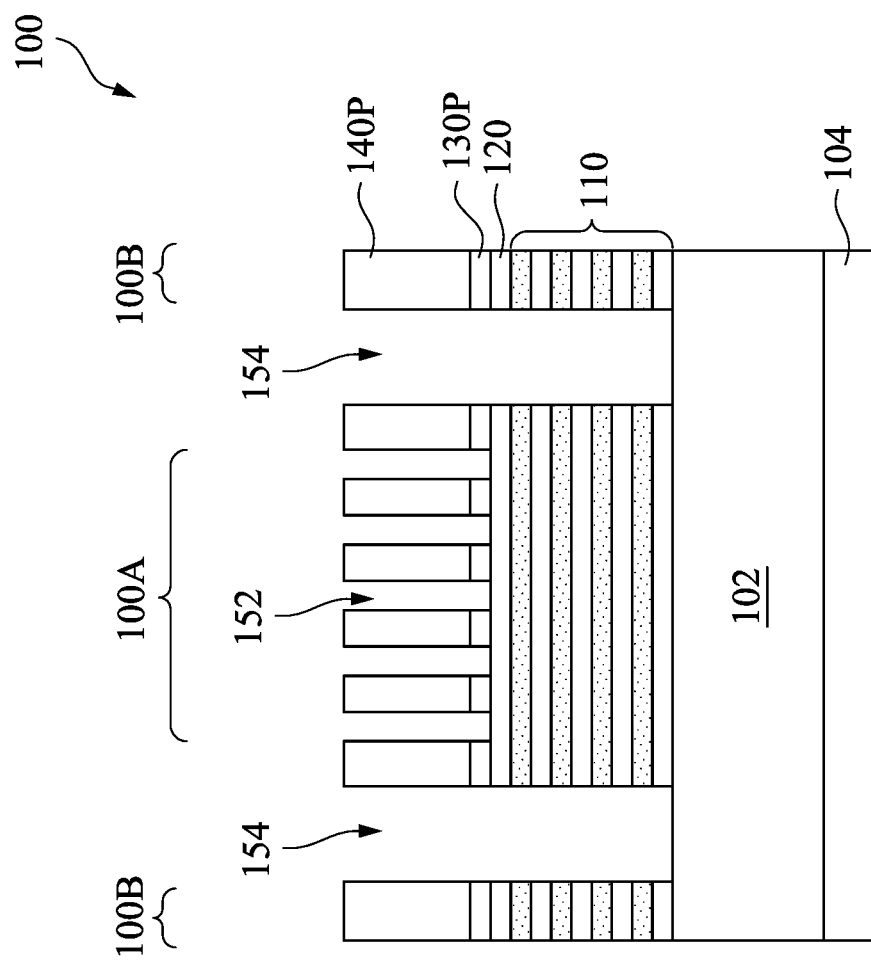
FIG. 1 is a cross-sectional view of an extreme ultraviolet (EUV) mask, in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks) in order to transfer the design of each layer of the ICs onto a semiconductor substrate during the semiconductor device fabrication process.

With the shrinkage in IC size, extreme ultraviolet (EUV) light with a wavelength of 13.5 nm is employed in, for example, a lithographic process to enable transfer of very small patterns (e.g., nanometer-scale patterns) from a mask to a semiconductor wafer. Because most materials are highly absorbing at the wavelength of 13.5 nm, EUV lithography utilizes a reflective-type EUV mask having a reflective multilayer to reflect the incident EUV light and an absorber layer on top of the reflective multilayer to absorb radiation in areas where light is not supposed to be reflected by the mask. The mask pattern is defined by the absorber layer and is transferred to a semiconductor wafer by reflecting EUV light off portions of a reflective surface of the EUV mask.

In EUV lithography, to separate the reflected light from the incident light, the EUV mask is illuminated with obliquely incident light that is tilted at a 6-degree angle from normal. The oblique incident EUV light is reflected by the reflective multilayer or absorbed by the absorber layer. Durability of the EUV mask is a factor in producing well defined desired feature sizes without pattern placement shifts. In addition, durability of the EUV mask is factor in the throughput of an EUV lithography system. For example, EUV masks of greater durability can extend the length of time an EUV mask can be utilized and lengthen the time between EUV mask replacements.

In embodiments of the present disclosure, ion-assisted deposition processes for forming a capping layer over a reflective multilayer stack of an EUV mask have been developed. In some embodiments, the ion-assisted process includes an ion beam deposition process or a sputtering process. In some embodiments, the ion-assisted deposition process is carried out on a surface of the reflective multi-stack layer which has been pretreated to reduce intermixing or diffusion between the capping layer and the surface of the reflective multilayer stack. In some embodiments, the pretreatment includes plasma pretreatment or exposure to an oxygen containing or nitrogen containing gas. By utilizing the developed ion-assisted processes, an amorphous capping layer is formed. The amorphous capping layer may be denser and include fewer grain boundaries compared to capping layers that are formed by other methods, such as methods that do not employ an ion-assisted process described herein. The ion assisted processes described herein render the capping layer more durable than capping layers formed by other methods, such as methods that do not employ an ion-assisted process described herein. In addition, the amorphous capping layer may be stronger than capping layers have a crystalline or polycrystalline structure or are formed by other methods, such as methods that do not employ an ion-assisted process described herein. The increased strength makes the amorphous capping layer less susceptible to diffusion of oxygen through the capping layer.

Diffusion of oxygen through the capping layer is undesirable because the diffused oxygen can oxidize layers of the multilayer stack the oxygen comes in contact with. As a result of this improved durability and strength of the capping layer, scanner throughput is improved.

FIG. 1 is a cross-sectional view of an EUV mask 100, in accordance with a first embodiment of the present disclosure. Referring to FIG. 1, the EUV mask 100 includes a substrate 102, a reflective multilayer stack 110 over a front surface of the substrate 102, a capping layer 120 over the reflective multilayer stack 110, a patterned buffer layer 130P over the capping layer 120, and a patterned absorber layer 140P over the patterned buffer layer 130P. The EUV mask 100 further includes a conductive layer 104 over a back surface of the substrate 102 opposite the front surface.

The patterned absorber layer 140P and the patterned buffer layer 130P contain a pattern of openings 152 that correspond to circuit patterns to be formed on a semiconductor wafer. The pattern of openings 152 is located in a pattern region 100A of the EUV mask 100, exposing a surface of the capping layer 120. The pattern region 100A is surrounded by a peripheral region 100B of the EUV mask 100. The peripheral region 100B corresponds to a non-patterned region of the EUV mask 100 that is not used in an exposing process during IC fabrication. In some embodiments, the pattern region 100A of EUV mask 100 is located at a central region of the substrate 102, and the peripheral region 100B is located at an edge portion of the substrate 102. The pattern region 100A is separated from the peripheral region 100B by trenches 154. The trenches 154 extend through the patterned absorber layer 140P, the patterned buffer layer 130P, the capping layer 120, and the reflective multilayer stack 110, exposing the front surface of the substrate 102.

Figure 2:
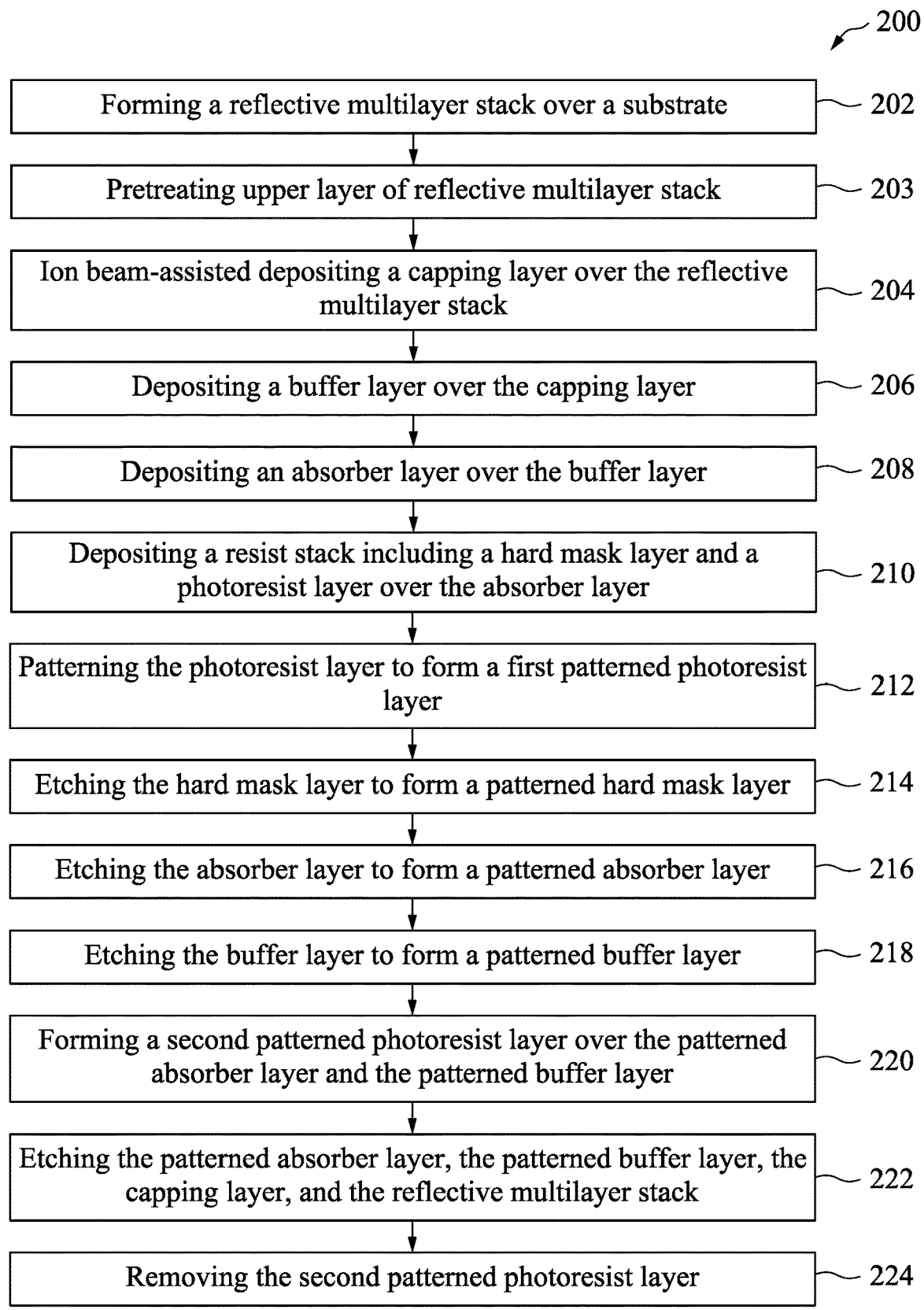
FIG. 2 is a flowchart of a method for fabricating the EUV mask of FIG. 1, in accordance with some embodiments.

FIG. 2 is a flowchart of a method 200 for fabricating an EUV mask, for example, EUV mask 100, in accordance with some embodiments. FIG. 3A through FIG. 3L are cross-sectional views of the EUV mask 100 at various stages of the fabrication process, in accordance with some embodiments. The method 200 is discussed in detail below, with reference to the EUV mask 100. In some embodiments, additional operations are performed before, during, and/or after the method 200, or some of the operations described are replaced and/or eliminated. In some embodiments, some of the features described below are replaced or eliminated. For example as described below with reference to FIG. 4, in some embodiments, the buffer layer 130 is an optional layer. One of ordinary skill in the art would understand that although some embodiments are discussed with operations performed in a particular order, these operations may be performed in another logical order.

Figure 3A:
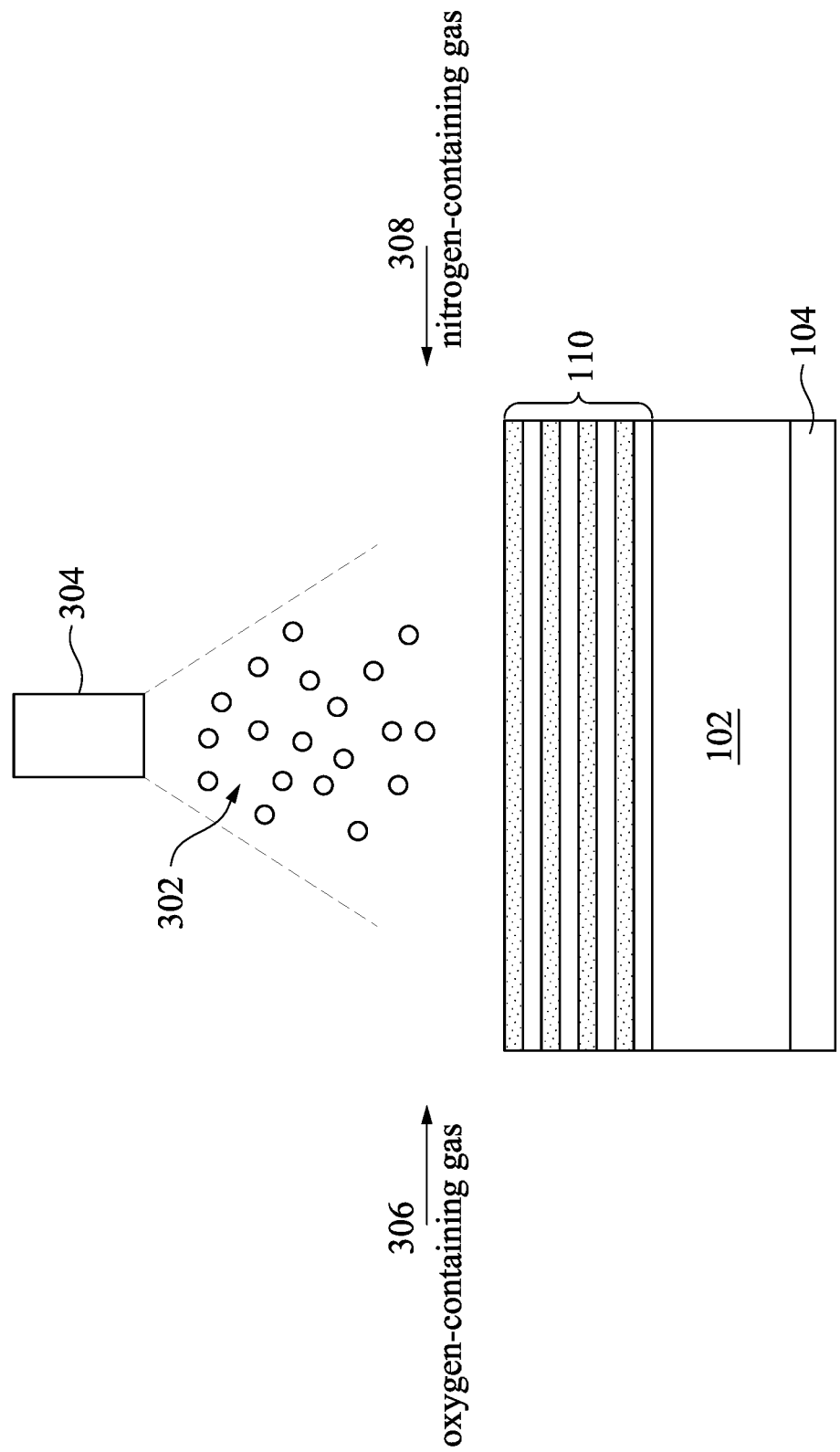
FIGS. 3A-3L are cross-sectional views of an EUV mask at various stages of the fabrication process of FIG. 2, in accordance with some embodiments.

Referring to FIGS. 2 and 3A, the method 200 includes operation 202, in which a reflective multilayer stack 110 is formed over a substrate 102, in accordance with some embodiments. FIG. 3A is a cross-sectional view of an initial structure of an EUV mask 100 after forming the reflective multilayer stack 110 over the substrate 102, in accordance with some embodiments.

Referring to FIG. 3A, the initial structure of the EUV mask 100 includes a substrate 102 made of glass, silicon, or other low thermal expansion materials. The low thermal expansion material helps to minimize image distortion due to mask heating during use of the EUV mask 100. In some embodiments, the substrate 102 includes fused silica, fused quartz, calcium fluoride, silicon carbide, black diamond, or titanium oxide doped silicon oxide ($SiO_2/TiO_2$) In some embodiments, the substrate 102 has a thickness ranging from about 1 mm to about 7 mm. If the thickness of the substrate 102 is too small, a risk of breakage or warping of the EUV mask 100 increases, in some instances. On the other hand, if the thickness of the substrate is too great, a weight of the EUV mask 100 is needlessly increased, in some instances.

In some embodiments, a conductive layer 104 is disposed on a back surface of the substrate 102. In some embodiments, the conductive layer 104 is in direct contact with the back surface of the substrate 102. The conductive layer 104 is adapted to provide for electrostatically coupling of the EUV mask 100 to an electrostatic mask chuck (not shown) during fabrication and use of the EUV mask 100. In some embodiments, the conductive layer 104 includes chromium nitride (CrN) or tantalum boride (TaB). In some embodiments, the conductive layer 104 is formed by a deposition process such as, for example, chemical vapor deposition (CVD), plasma-enhanced chemical vapor deposition (PECVD), or physical vapor deposition (PVD). The thickness of the conductive layer 104 is controlled such that the conductive layer 104 is optically transparent.

The reflective multilayer stack 110 is disposed over a front surface of the substrate 102 opposite the back surface. In some embodiments, the reflective multilayer stack 110 is in direct contact with the front surface of the substrate 102. The reflective multilayer stack 110 provides a high reflectivity to the EUV light. In some embodiments, the reflective multilayer stack 110 is configured to achieve about 60% to about 75% reflectivity at the peak EUV illumination wavelength, e.g., the EUV illumination at 13.5 nm. Specifically, when the EUV light is applied at an incident angle of 6° to the surface of the reflective multilayer stack 110, the maximum reflectivity of light in the vicinity of a wavelength of 13.5 nm is about 60%, about 62%, about 65%, about 68%, about 70%, about 72%, or about 75%

In some embodiments, the reflective multilayer stack 110 includes alternatively stacked layers of a high refractive index material and a low refractive index material. A material having a high refractive index has a tendency to scatter EUV light on the one hand, and a material having a low refractive index has a tendency to transmit EUV light on the other hand. Pairing these two types of materials together provides a resonant reflectivity. In some embodiments, the reflective multilayer stack 110 includes alternatively stacked layers of molybdenum (Mo) and silicon (Si). In some embodiments, the reflective multilayer stack 110 includes alternatively stacked Mo and Si layers with Si being in the topmost layer. In some embodiments, a molybdenum layer is in direct contact with the front surface of the substrate 102. In other some embodiments, a silicon layer is in direct contact with the front surface of the substrate 102. Alternatively, the reflective multilayer stack 110 includes alternatively stacked layers of Mo and beryllium (Be).

The thickness of each layer in the reflective multilayer stack 110 depends on the EUV wavelength and the incident angle of the EUV light. The thickness of alternating layers in the reflective multilayer stack 110 is tuned to maximize the constructive interference of the EUV light reflected at each interface and to minimize the overall absorption of the EUV light. In some embodiments, the reflective multilayer stack 110 includes from 30 to 60 pairs of alternating layers of Mo and Si, many more than depicted in FIG. 1. Each Mo/Si pair has a thickness ranging from about 2 nm to about 7 nm, with a total thickness ranging from about 100 nm to about 300 nm.

In some embodiments, each layer in the reflective multilayer stack 110 is deposited over the substrate 102 and underlying layer using ion beam deposition (IBD) or DC magnetron sputtering. The deposition method used helps to ensure the thickness uniformity of the reflective multilayer stack 110 is better than about 0.85 across the substrate 102. For example, to form a Mo/Si reflective multilayer stack 110, a Mo layer is deposited using a Mo target as the sputtering target and an argon (Ar) gas (having a gas pressure of from $1.3 \times 10^{-2}$ Pa to $2.7 \times 10^{-2}$ Pa) as the sputtering gas with an ion acceleration voltage of from 300 V to 1,500 V at a deposition rate of from 0.03 to 0.30 nm/sec and then a Si layer is deposited using a Si target as the sputtering target and an Ar gas (having a gas pressure of $1.3 \times 10^{-2}$ Pa to $2.7 \times 10^{-2}$ Pa) as the sputtering gas, with an ion acceleration voltage of from 300 V to 1,500 V at a deposition rate of from 0.03 to 0.30 nm/sec. By stacking Si layers and Mo layers in 40 to 50 cycles, each of the cycles comprising the above steps, the Mo/Si reflective multilayer stack is deposited.

Referring to FIGS. 2 and 3A, the method 200 proceeds to operation 203, in which a top layer of reflective multi-stack layer 110, e.g., a Si layer is treated in accordance with embodiments of the present disclosure to reduce intermixing or diffusion between the top layer or other layers of reflective multi-stack layer 110 and subsequently formed capping layer 120. Reducing intermixing or diffusion between the layers of the reflective multi-stack layer 110 and the capping layer is desirable because such intermixing or diffusion reduces the reflectivity of the multi-stack layer 110. In accordance with one embodiment, the top layer of reflective multi-stack layer 110 is plasma treated, e.g., with an Ar plasma 302 from an argon plasma generator 304. Embodiments in accordance with the present disclosure are not limited to pretreatment of the top layer of the reflective multi-stack layer 110 using an Ar plasma, for example, other plasmas may be utilized to pretreat the top layer of the reflective multi-stack layer 110. In some embodiments, the Ar plasma treatment is carried out at a temperature less than a temperature which would cause interdiffusion between the different material layers of the multi-stack layer 110. For example, when the alternating layers of the reflective multi-stack layer 110 are Mo and Si, the Ar plasma treatment can be carried out at a temperature less than about 150° C. Interdiffusion between the different material layers of the multi-stack layer 110 is undesirable because it has a negative effect on the reflectivity of the multi-stack layer 110. In some embodiments, the Ar plasma treatment is carried out at a pressure on the order of tens of millitorr for a period of time on the order of tens of minutes. Embodiments in accordance with the present disclosure are not limited to carrying out the plasma pretreatment of the top layer of the multi-stack layer 110 these pressures or periods of time. For example, the plasma pretreatment can be carried out at higher pressures and for longer periods of time. When the pretreatment of the top layer of the reflective multi-stack layer 110 is not carried out for a sufficient period of time, effective reduction in intermixing or diffusion between the top layer of the reflective multi-stack layer 110 and the subsequently formed capping layer 120 may not be observed.

FIG. 3A illustrates another embodiment of pretreatment of the top layer of the multi-stack layer 110. In this embodiment, the top layer of the multi-stack layer 110 is exposed to an oxygen containing gas 306, a nitrogen containing gas 308, or both. For example, in one embodiment, the top layer of the multi-stack layer 110 is exposed to air. The exposure to air can be at atmospheric pressure and at a temperature that is less than a temperature at which interdiffusion between different material layers of the multi-stack layer 110 occurs. For example, when the alternating layers of the reflective multi-stack layer 110 are Mo and Si, the exposure to air can be carried out at a temperature that is less than about 150° C. for a period of tens of minutes in order to minimize interdiffusion between different material layers of the multi-stack layer. Embodiments in accordance with the present disclosure are not limited to exposing the top layer of the multi-stack layer 110 to air at these pressures and time periods. For example, the top layer of the multi-stack layer 110 can be exposed to air at higher or lower pressures and for longer or shorter periods of time. The exposure to an oxygen containing gas or a nitrogen containing gas modifies the top layer using oxidation or nitrification with or without input of thermal energy.

In some embodiments, pretreatment of the top layer of the multi-stack layer 110 alters the top 1 nm to about 3 nm of the top layer. If the alteration of the top layer is insufficient and the full benefit of the pretreatment may not be achieved. For example, in such case, the capping layer material can still be deposited directly on the surface of the reflective multilayer structure 110, and the intermixing of the capping layer material and silicon can occur in regions where pretreatment of the reflective multilayer structure 110 is insufficient. The intermixing of the capping layer material and silicon reduce the uniformity and durability of the capping layer 120, which adversely affects the quality of the EUV mask 100. On the other hand, if the pretreatment thickness is too large, a decrease in the reflectivity of the reflective multilayer structure 110 may occur, which leads to critical dimension (CD) errors in the lithography processes, in some instances.

In accordance with another embodiment, pretreatment of the top layer of the multi-stack layer 110 can be supplemented by providing a layer of tantalum or zirconium over the pretreated top layer of the multi-stack layer 110. This layer of tantalum or zirconium can act as a barrier layer, preventing the intermixing of the metal in the capping layer and silicon in the top silica layer of the reflective multilayer structure 110. As a result, the stability of the EUV mask is improved. The layer of tantalum or zirconium can be formed using a deposition process such as, for example, CVD, PECVD and PVD or atomic layer deposition (ALD).

Figure 3B:
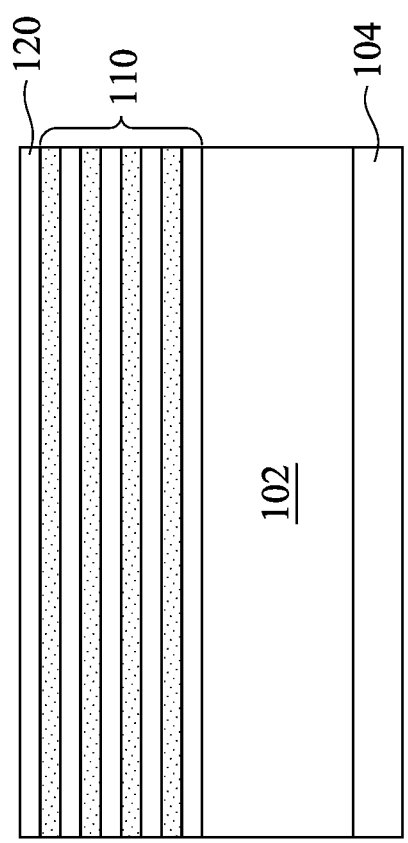
Figure 7:
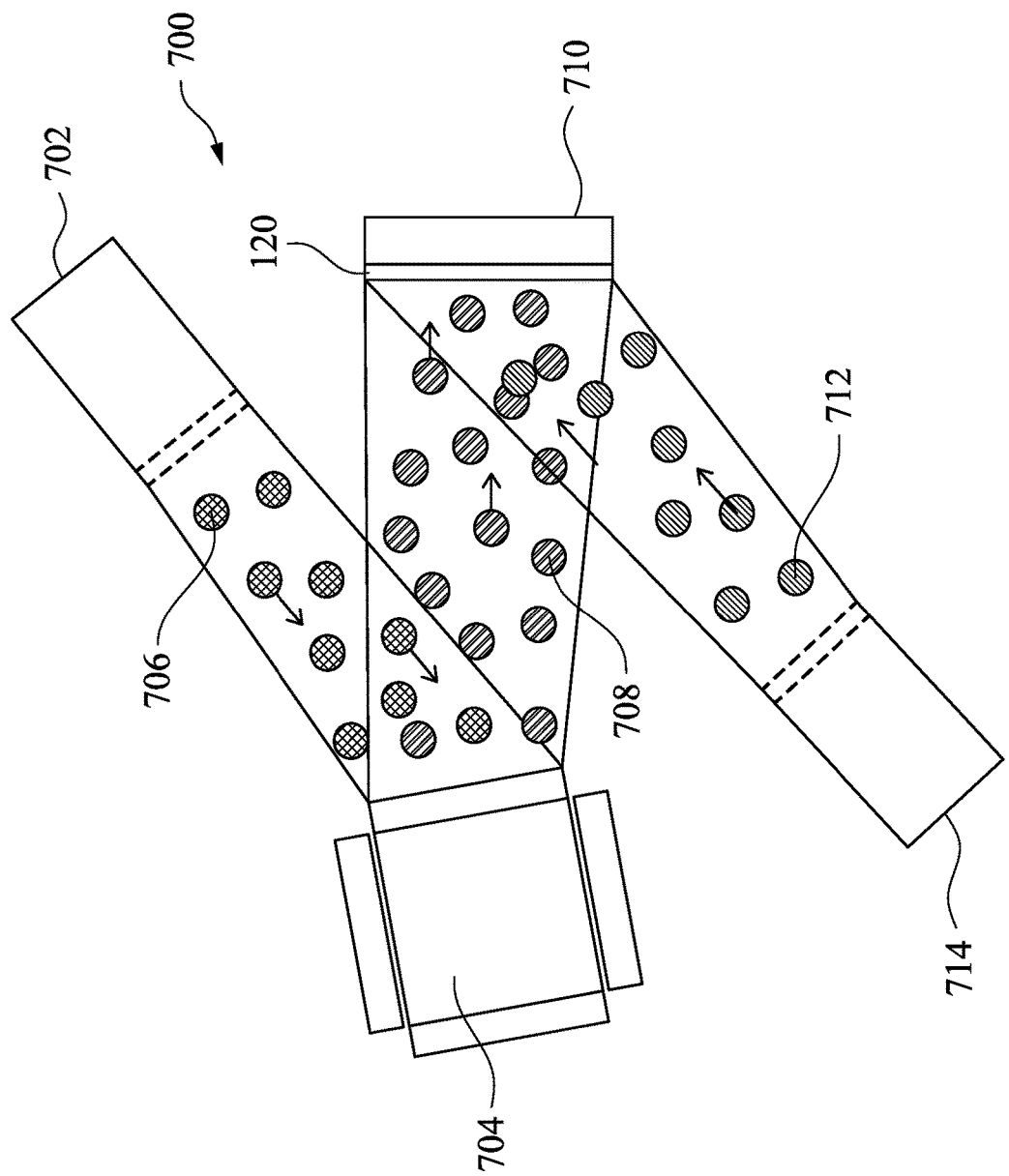
FIG. 7 is a schematic view of an ion-assisted ion beam deposition in accordance with some embodiments.
Figure 8:
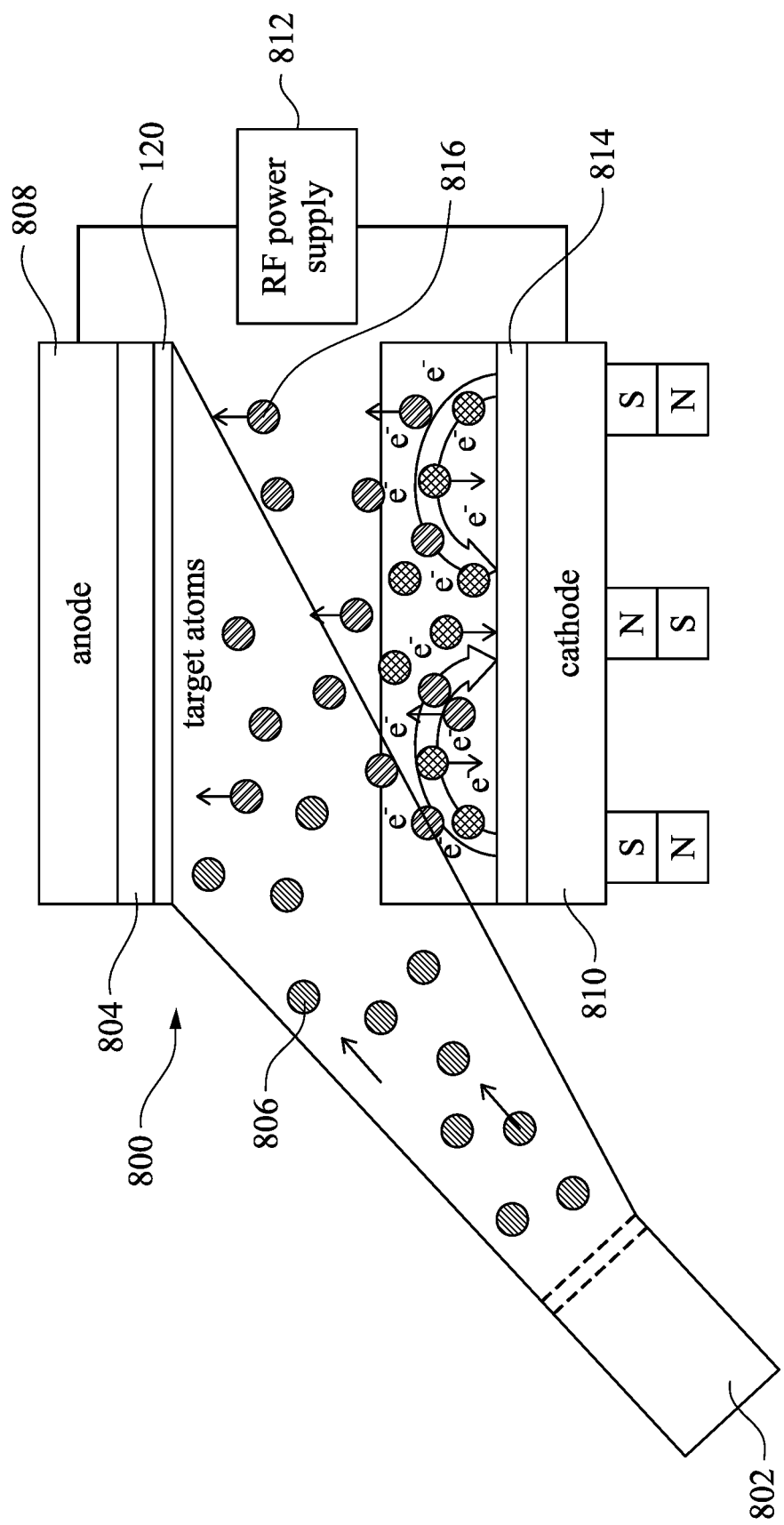
FIG. 8 is a schematic view of an ion-assisted sputtering in accordance with some embodiments.

Referring to FIGS. 2, 3B, 7 and 8, the method 200 proceeds to operation 204, in which a capping layer 120 is deposited over the reflective multilayer stack 110 using an ion assisted deposition process (e.g., ion beam deposition in FIG. 7 and sputtering in FIG. 8), in accordance with some embodiments. FIG. 3B is a cross-sectional view of the structure of FIG. 3A after depositing the capping layer 120 over the reflective multilayer stack 110, in accordance with some embodiments. FIG. 7 is a schematic of an ion assisted ion beam deposition process in accordance with embodiments of the present disclosure. FIG. 8 is a schematic of an ion assisted sputtering process in accordance with embodiments of the present disclosure.

Referring to FIG. 3B, the capping layer 120 is disposed over the topmost surface of the reflective multilayer stack 110. The capping layer 120 helps to protect the reflective multilayer stack 110 from oxidation and any chemical etchants to which the reflective multilayer stack 110 may be exposed during subsequent mask fabrication processes.

In some embodiments, the capping layer 120 includes a material that resists oxidation and corrosion, and has a low chemical reactivity with common atmospheric gas species such as oxygen, nitrogen, and water vapor. In some embodiments, the capping layer 120 includes a transition metal such as, for example, ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn), technetium (Tc), titanium (Ti) or alloys thereof.

In some embodiments, the capping layer 120 further includes one or more dopants having a carbon solubility less than a carbon solubility of the material providing the capping layer 120. In some embodiments, the dopant has a carbon solubility less than that of the transition metal providing the capping layer 120. Exemplary dopants include, but are not limited to, niobium (Nb), titanium (Ti), zirconium (Zr), yttrium (Y), boron (B), and phosphorus (P). Introducing dopants into the capping layer 120 helps to prevent the accumulation of carbon in the capping layer 120 during the use of the EUV mask 100, which improves the long term stability of the EUV mask 100. The amount of the dopants in the capping layer 120 is controlled to prevent the formation of intermetallic compounds of two metals, which reduces uniformity of the capping layer 120. In some embodiments, the ratio of Ru and dopant element is controlled in a range from about 1:0 to about 2:1. In some embodiments, the concentration of dopants in the capping layer 120 is less than about 50 atomic percent (at. %). Because dopant elements normally have a density less than the density of Ru, if dopants are introduced into the capping layer 120, the density of the resulting capping layer 120 is less than the bulk density of Ru (e.g., about 12.45 g/cm$^3$). In some embodiments, the dopants are introduced into the capping layer 120 by ion implantation after the capping layer 120 is formed. In some embodiments, the dopants are co-deposited with the material providing the capping layer 120.

In some embodiments, the capping layer 120 is formed using an ion assisted deposition process such as, for example, ion beam deposition (IBD) or sputtering. In instances where a Ru layer is to be formed as the capping layer 120 using ion assisted IBD, the deposition may be carried out in an Ar atmosphere by using a Ru target as the sputtering target.

Referring to FIG. 7, in one embodiment, capping layer 120 is formed by an ion assisted, ion beam deposition process 700. The ion beam deposition process employs an ion source 702 which bombards a target 704 with ions 706, e.g., ions of a noble gas such as Ar or Xe. The ions 706 excite the target 704 causing ions 708 of the target material to be emitted from the target 704 and directed towards the substrate 710. In accordance with embodiments of the present disclosure, substrate 710 is the pretreated reflective multi-stack 110 of FIG. 3A. In accordance with embodiments of the present disclosure, when capping layer 120 is formed using Ru, target 704 comprises Ru and the target ions 708 are Ru ions. The ion beam deposition may be carried out at an ion acceleration voltage of between about 800 to 1200 volts, although embodiments in accordance with the present disclosure are not limited to carrying out the ion beam deposition within such voltage range. In an embodiment where the target ions 708 are Ru and the noble gas is Ar, the assist ion source 714 generates Ar ions that are directed to the surface of substrate 710 upon which the target ions 708 impinge. In accordance with an embodiment of the present disclosure, the ion beam deposition is carried out at known conditions, for example, at an ion acceleration voltage between about 800 to 1200 V and a temperature below temperatures where interdiffusion between differing materials of the reflective multi-stack layer 110 will occur, e.g., below about 150° C. when the materials of the multi-stack layer include Mo and Si. Interdiffusion between the different material layers of the multi-stack layer 110 is undesirable because it has a negative effect on the reflectivity of the multi-stack layer 110.

Continuing to refer to FIG. 7, in accordance with an embodiment, the ion assist is carried out in the same atmosphere, at the same pressure and for a length of time that are substantially the same as the atmosphere, pressure and length of time conditions at which the ion deposition process is carried out. In an embodiment, the ion assist is conducted at a ion acceleration voltage that is less than the ion acceleration voltage employed by the ion deposition process. For example, in some embodiments, the ratio of the ion acceleration voltage at which the ion assist is carried out to the ion acceleration voltage that the ion deposition is carried out ranges between about 1:2 to 1:3. For example, the voltage at which the ion assist is carried out can be less than 50% of the voltage at which the ion deposition process is carried out. In other embodiments, the ion assist is carried out at a voltage that is less than 40% of the voltage at which the ion deposition process is carried out. In some embodiments, the ion assist is carried out at a voltage that is less than about 30% of the voltage at which the ion deposition process is carried out. Operating the ion assist at these lower voltages reduces the likelihood that the assist ions will dislodge target ions that have deposited on the substrate surface. Operating the ion assist at these lower voltages reduces the electrical energy demand of the process. On the other hand, if the ion assist is operated at too low a voltage, the assist ions may not provide the kinetic energy needed for the target ions to have sufficient kinetic energy to form the desired amorphous structure of the capping layer. Amorphous structure of a capping layer is characterized by the absence of long-range order that is characteristic of a crystal. Amorphous materials do not have a regular arrangement in three dimensions, have irregular or curved surfaces, do not provide well resolved x-ray diffraction patterns, are generally isotropic and behave as a pseudo solid. For example, in accordance with some embodiments of the present disclosure, an amorphous ruthenium capping layer may exhibit a grain size less than about 0.3 nm.

Referring to FIG. 8, in another embodiment, capping layer 120 is formed by a sputtering process 800, e.g., a magnetron sputtering process which is ion assisted. The ion assisted magnetron sputtering process employs ion source 802 which bombards a target, e.g., surface of substrate 804 where capping layer 120 is formed, with assist ions 806. The description of ion source 714 with respect to FIG. 7 applies equally to ion source 802. Magnetron sputtering process 800 employees an anode 808 and a cathode 810. Anode 808 and cathode 810 are electrically connected to an RF power source 812. A target 814 is electrically connected to cathode 810. The substrate 804 is electrically connected to anode 808. The magnetron sputtering device is operated in a known manner to generate a plasma which ionizes an inert gas. Portions of the ionized gas impact the target 814 to create charged ions 816 from the target 814. Charged ions 816 are directed toward substrate 804 by the electrical bias created between cathode 810 and anode 808. In one embodiment, the charged ions 816 are Ru ions which deposit to form capping layer 120. In accordance with an embodiment of the present disclosure, assist ions 806 are directed towards the surface of the substrate 804 as the capping layer 120 is formed on substrate 804. The description regarding the operation of ion source 714 and the effect of the assist ions 712 with respect to FIG. 7 applies to the operation of ion source 802 and the assist ions 806 of FIG. 8. Embodiments in accordance with the present disclosure are not limited to utilizing RF magnetron sputtering. For example, DC magnetron sputtering can be ion assisted in accordance with the present disclosure and used to form capping layer 120.

The magnetron sputtering may be carried out at about 800 to 1200 volts, although embodiments in accordance with the present disclosure are not limited to carrying out the magnetron sputtering deposition within such voltage range. In an embodiment where the target ions 816 are Ru and the noble gas is Ar, the assist ion source 802 generates Ar ions that are directed to the surface of substrate 804 upon which the target ions 816 impinge. In accordance with an embodiment of the present disclosure, the magnetron sputtering deposition is carried out at known conditions, for example, a temperature below about 150° C.

Continuing to refer to FIG. 8, in accordance with an embodiment, the ion assist is carried out in the same atmosphere, at the same pressure and for a length of time that are substantially the same as the atmosphere, pressure and length of time conditions at which the magnetron sputtering process is carried out. In an embodiment, the ion assist is conducted at a voltage that is less than the voltage employed by the magnetron sputtering process. For example, in some embodiments, the ratio of the voltage at which the ion assist is carried out to the voltage that the magnetron sputtering is carried out ranges between about 1:2 to 1:3. For example, the voltage at which the ion assist is carried out can be less than 50% of the voltage at which the magnetron sputtering process is carried out. In other embodiments, the ion assist is carried out at a voltage that is less than 40% of the voltage at which the magnetron sputtering process is carried out. In some embodiments, the ion assist is carried out at a voltage that is less than about 30% of the voltage at which the magnetron sputtering process is carried out. Operating the ion assist at these lower voltages reduces the likelihood that the assist ions will dislodge target ions that have deposited on the substrate surface. Operating the ion assist at these lower voltages reduces the electrical energy demand of the process. On the other hand, if the ion assist is operated at too low a voltage, the assist ions may not provide the kinetic energy needed for the target ions to have sufficient kinetic energy to form the desired amorphous structure of the capping layer.

In accordance with embodiments of the present disclosure, after formation of capping layer 120 is completed, capping layer may be subjected to the plasma, oxygen containing gas or nitrogen containing gas pretreatment described above with respect to FIG. 3A.

Figure 3C:
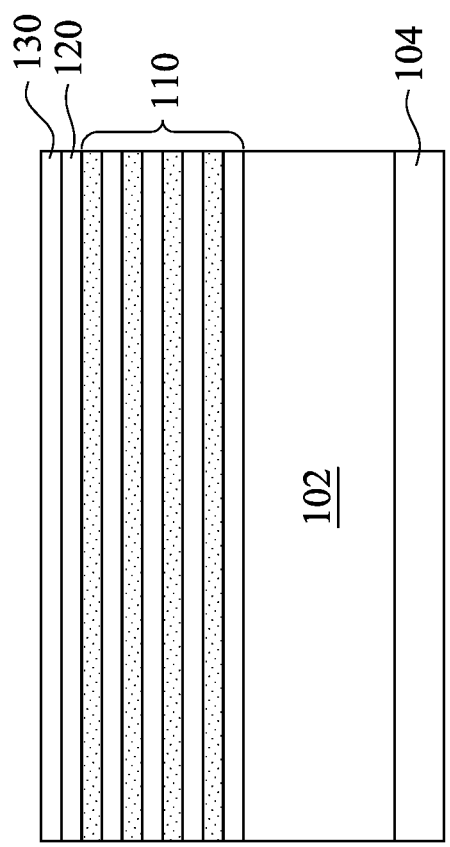

Referring to FIGS. 2 and 3C, the method 200 proceeds to operation 206, in which a buffer layer 130 is deposited over the capping layer 120, in accordance with some embodiments. In accordance with other embodiments, such as that described below with reference to FIG. 5, buffer layer 130 may be omitted. FIG. 3C is a cross-sectional view of the structure of FIG. 3B after depositing the buffer layer 130 over the capping layer 120, in accordance with some embodiments.

Referring to FIG. 3C, the buffer layer 130 is disposed on the capping layer 120. The buffer layer 130 possesses different etching characteristics from an absorber layer subsequently formed thereon, and thereby serves as an etch stop layer to prevent damages to the capping layer 120 during patterning of an absorber layer subsequently formed thereon. Further, the buffer layer 130 may also serve later as a sacrificial layer for focused ion beam repair of defects in the absorber layer. In some embodiments, the buffer layer 130 includes ruthenium boride (RuB), ruthenium silicide (RuSi), chromium oxide (CrO), or chromium nitride (CrN).

In some other embodiments, the buffer layer 130 includes a dielectric material such as, for example, silicon oxide or silicon oxynitride. In some embodiments, the buffer layer 130 is deposited by CVD, PECVD, or PVD.

Figure 3D:
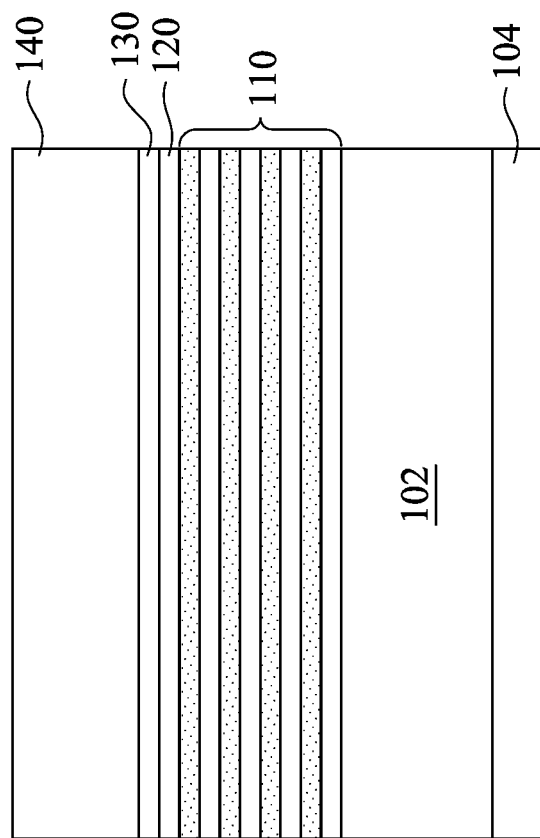

Referring to FIGS. 2 and 3D, the method 200 proceeds to operation 208, in which an absorber layer 140 is deposited over the buffer layer 130, in accordance with various embodiments. FIG. 3D is a cross-sectional view of the structure of FIG. 3C after depositing the absorber layer 140 over the buffer layer 130, in accordance with some embodiments.

Referring to FIG. 3D, the absorber layer 140 is disposed in direct contact with the buffer layer 130. The absorber layer 140 is usable to absorb radiation in the EUV wavelength projected onto the EUV mask 100.

The absorber layer 140 includes an absorber material having a high extinction coefficient κ and a low refractive index n in EUV wavelengths. In some embodiments, the absorber layer 140 includes an absorber material having a high extinction coefficient and a low refractive index at 13.5 nm wavelength. In some embodiments, the extinction coefficient κ of the absorber material of the absorber layer 140 is in a range from about 0.01 to 0.08. In some embodiments, the refractive index n of the absorber material of the absorber layer 140 is in a range from 0.87 to 1.

In some embodiments, the absorber layer 140 has a single layer structure. In some other embodiments, the absorber layer 140 has a multilayer structure. In some embodiments, the absorber layer 140 is formed by a deposition process such as, for example, PVD, CVD, ALD, RF magnetron sputtering, DC magnetron sputtering, or IBD.

The absorber layer 140 is deposited as an amorphous layer. By maintaining an amorphous phase, the overall roughness of the absorber layer 140 is improved. The thickness of the absorber layer 140 is controlled to provide between 95% and 99.5% absorption of the EUV light at 13.5 nm. In some embodiments, the absorber layer 140 may have a thickness ranging from about 5 nm to about 50 nm. If the thickness of the absorber layer 140 is too small, the absorber layer 140 is not able to absorb a sufficient amount of the EUV light to generate contrast between the reflective areas and non-reflective areas. On the other hand, if the thickness of the absorber layer 140 is too great, the precision of a pattern to be formed in the absorber layer 140 tends to be low.

Figure 3E:
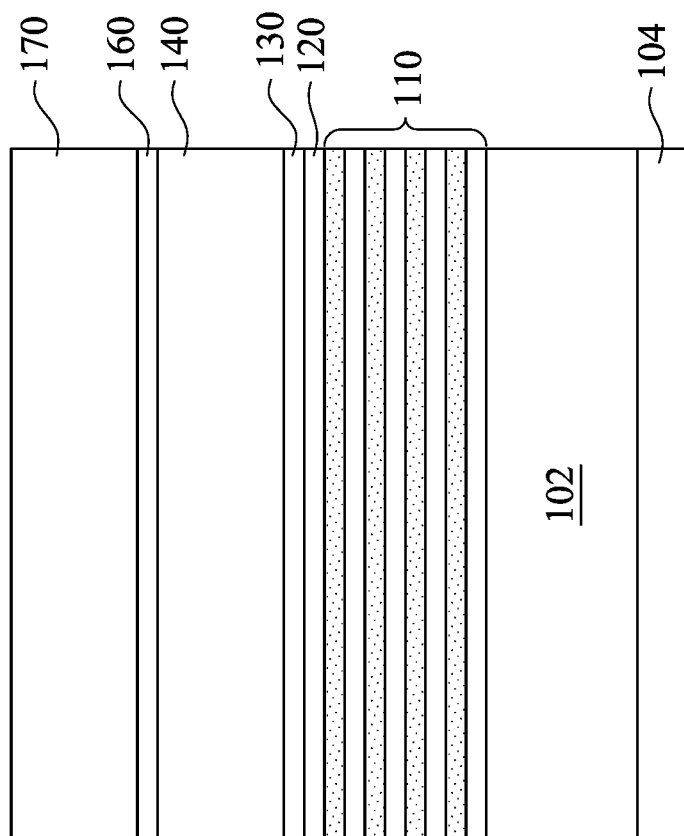

Referring to FIGS. 2 and 3E, the method 200 proceeds to operation 210, in which a resist stack including a hard mask layer 160 and a photoresist layer 170 is deposited over the absorber layer 140, in accordance with some embodiments. FIG. 3E is a cross-sectional view of the structure of FIG. 3D after sequentially depositing the hard mask layer 160 and the photoresist layer 170 over the absorber layer 140, in accordance with some embodiments.

Referring to FIG. 3E, the hard mask layer 160 is disposed over the absorber layer 140. In some embodiments, the hard mask layer 160 is in direct contact with the absorber layer 140. In some embodiments, the hard mask layer 160 includes a dielectric oxide such as silicon dioxide or a dielectric nitride such as silicon nitride. In some embodiments, the hard mask layer 160 is formed using a deposition process such as, for example, CVD, PECVD, or PVD.

The photoresist layer 170 is disposed over the hard mask layer 160. The photoresist layer 170 includes a photosensitive material operable to be patterned by radiation. In some embodiments, the photoresist layer 170 includes a positive-tone photoresist material, and a negative-tone photoresist material or a hybrid-tone photoresist material. In some embodiments, the photoresist layer 170 is applied to the surface of the hard mask layer 160, for example, by spin coating.

Figure 3F:
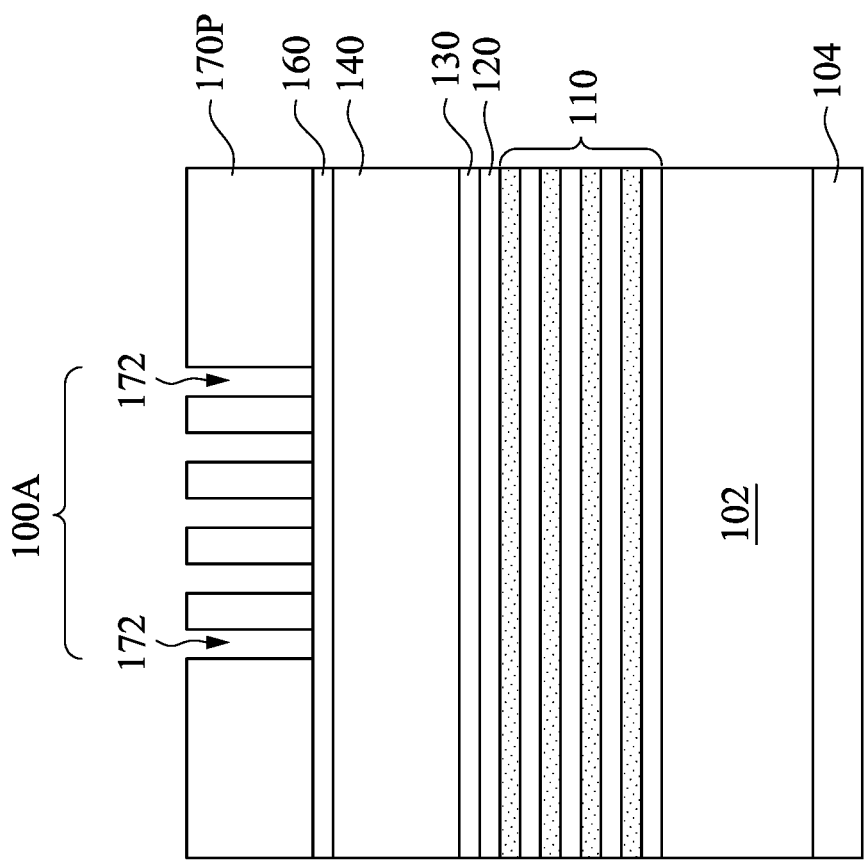

Referring to FIGS. 2 and 3F, the method 200 proceeds to operation 212, in which the photoresist layer 170 is lithographically patterned to form a patterned photoresist layer 170P, in accordance with some embodiments. FIG. 3F is a cross-sectional view of the structure of FIG. 3E after lithographically patterning the photoresist layer 170 to form the patterned photoresist layer 170P, in accordance with some embodiments.

Referring to FIG. 3F, the photoresist layer 170 is patterned by first subjecting the photoresist layer 170 to a pattern of irradiation. Next, the exposed or unexposed portions of the photoresist layer 170 are removed depending on whether a positive-tone or negative-tone resist is used in the photoresist layer 170 with a resist developer, thereby forming the patterned photoresist layer 170P having a pattern of openings 172 formed therein. The openings 172 expose portions of the hard mask layer 160. The openings 172 are located in the pattern region 100A and correspond to locations where the pattern of openings 152 are present in the EUV mask 100 (FIG. 1).

Figure 3G:
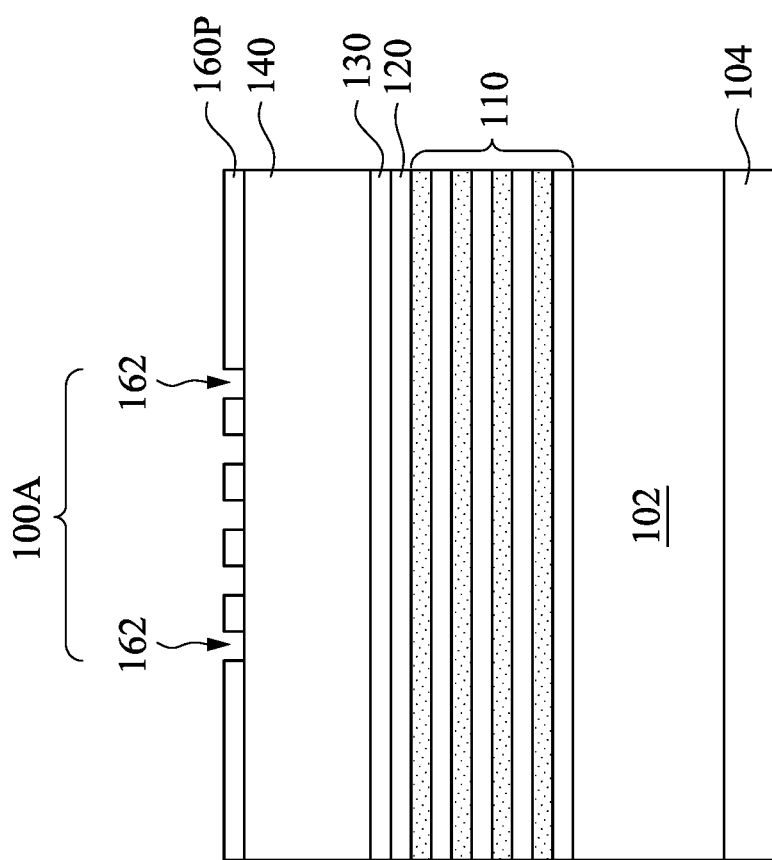

Referring to FIGS. 2 and 3G, the method 200 proceeds to operation 214, in which the hard mask layer 160 is etched using the patterned photoresist layer 170P as an etch mask to form a patterned hard mask layer 160P, in accordance with some embodiments. FIG. 3G is a cross-sectional view of the structure of FIG. 3F after etching the hard mask layer 160 to form the patterned hard mask layer 160P, in accordance with some embodiments.

Referring to FIG. 3G, portions of the hard mask layer 160 that are exposed by the openings 172 are etched to form openings 162 extending through the hard mask layer 160. The openings 162 expose portions of the underlying absorber layer 140. In some embodiments, the hard mask layer 160 is etched using an anisotropic etch. In some embodiments, the anisotropic etch is a dry etch such as, for example, reactive ion etch (RIE), a wet etch, or a combination thereof. The etch removes the material providing the hard mask layer 160 selective to the material providing the absorber layer 140. The remaining portions of the hard mask layer 160 constitute the patterned hard mask layer 160P. If not completely consumed during the etching of the hard mask layer 160, after etching the hard mask layer 160, the patterned photoresist layer 170P is removed from the surfaces of the patterned hard mask layer 160P, for example, using wet stripping or plasma ashing.

Figure 3H:
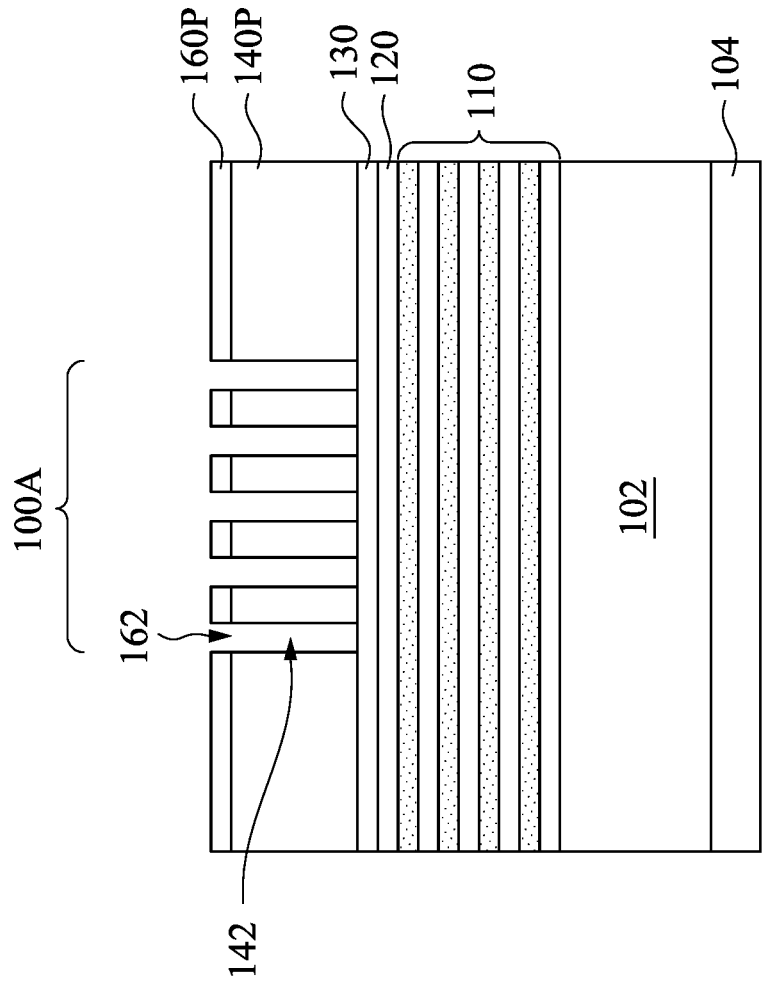

Referring to FIGS. 2 and 3H, the method 200 proceeds to operation 216, in which the absorber layer 140 is etched using the patterned hard mask layer 160P as an etch mask to form a patterned absorber layer 140P, in accordance with some embodiments. FIG. 3H is a cross-sectional view of the structure of FIG. 3G after etching the absorber layer 140 to form the patterned absorber layer 140P, in accordance with some embodiments.

Referring to FIG. 3H, portions of the absorber layer 140 that are exposed by the openings 162 are etched to form openings 142 extending through the absorber layer 140. The openings 142 expose portions of the underlying buffer layer 130. In some embodiments, the absorber layer 140 is etched using an anisotropic etching process. In some embodiments, the anisotropic etch is a dry etch such as, for example, RIE, a wet etch, or a combination thereof that removes the material providing the absorber layer 140 selective to the material providing the underlying buffer layer 130. For example, in some embodiments, the absorber layer 140 is dry etched with a gas that contains chlorine, such as $Cl_2$ or $BCl_3$, or with a gas that contains fluorine, such as $NF_3$. Ar may be used as a carrier gas. In some embodiments, oxygen (02) may also be included as the carrier gas. The etch rate and the etch selectivity depend on the etchant gas, etchant flow rate, power, pressure, and substrate temperature. After etching, the remaining portions of the absorber layer 140 constitute the patterned absorber layer 140P.

Figure 3I:
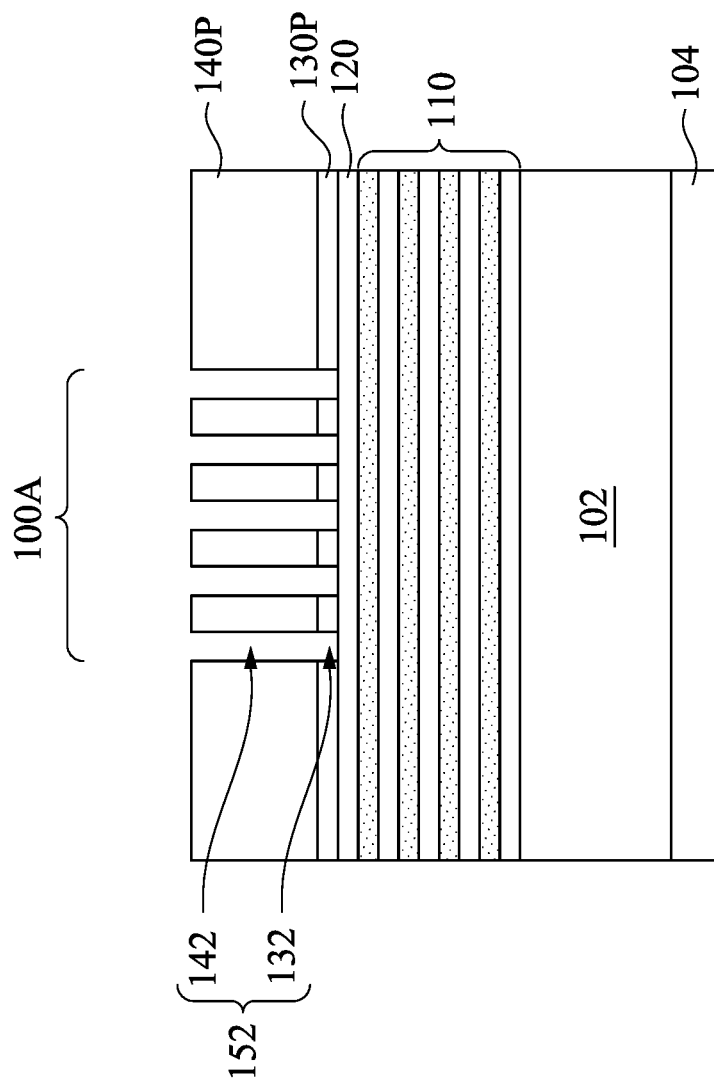

Referring to FIGS. 2 and 3I, the method 200 proceeds to operation 218, in which the buffer layer 130 is etched using the patterned hard mask layer 160P as an etch mask to form a patterned buffer layer 130P, in accordance with some embodiments. FIG. 3I is a cross-sectional view of the structure of FIG. 3H after etching the buffer layer 130 to form the patterned buffer layer 130P, in accordance with some embodiments.

Referring to FIG. 3I, portions of the buffer layer 130 that are exposed by the openings 162 and 142 are etched to form openings 132 extending through the buffer layer 130. The openings 132 expose portions of the underlying capping layer 120. In some embodiments, the buffer layer 130 is etched using an anisotropic etching process. In some embodiments, the anisotropic etch is a dry etch such as, for example, RIE, a wet etch, or a combination thereof that removes the material providing the buffer layer 130 selective to the material providing the capping layer 120. The remaining portions of the buffer layer 130 constitute the patterned buffer layer 130P. After etching the buffer layer 130, the patterned hard mask layer 160P is removed from the surfaces of the patterned absorber layer 140P, for example, using oxygen plasma or a wet etch.

The openings 142 in the patterned absorber layer 140P and respective underlying openings 132 in the patterned buffer layer 130P together define the pattern of openings 152 in the EUV mask 100.

Figure 3J:
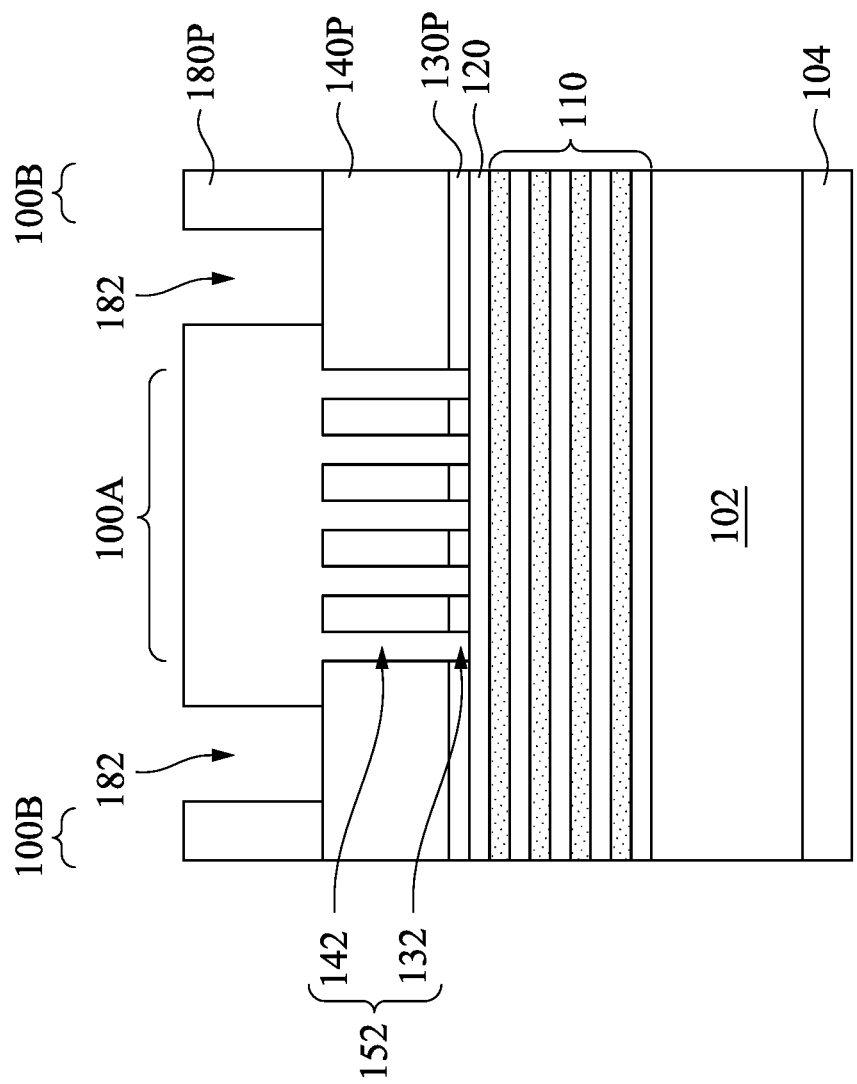

Referring to FIGS. 2 and 3J, the method 200 proceeds to operation 220, in which a patterned photoresist layer 180P comprising a pattern of openings 182 is formed over the patterned absorber layer 140P and the patterned buffer layer 130P, in accordance with some embodiments. FIG. 2J is a cross-sectional view of the structure of FIG. 3I after forming the patterned photoresist layer 180P comprising openings 182 over the patterned absorber layer 140P and the patterned buffer layer 130P, in accordance with some embodiments.

Referring to FIG. 3J, the openings 182 expose portions of the patterned absorber layer 140P at the periphery of the patterned absorber layer 140P. The openings 182 corresponding to the trenches 154 in the peripheral region 100B of the EUV mask 100 are to be formed. To form the patterned photoresist layer 180P, a photoresist layer (not shown) is applied over the patterned buffer layer 130P and the patterned absorber layer 140P. The photoresist layer fills the openings 132 and 142 in the patterned buffer layer 130P and the patterned absorber layer 140P, respectively. In some embodiments, the photoresist layer includes a positive-tone photoresist material, a negative-tone photoresist material or a hybrid-tone photoresist material. In some embodiments, the photoresist layer includes a same material as the photoresist layer 170 described above in FIG. 7. In some embodiments, the photoresist layer includes a different material from the photoresist layer 170. In some embodiments, the photoresist layer is formed, for example, by spin coating. The photoresist layer 170 is subsequently patterned by exposing the photoresist layer to a pattern of radiation, and removing the exposed or unexposed portions of the photoresist layer using a resist developer depending on whether a positive or negative resist is used. The remaining portions of the photoresist layer constitute the patterned photoresist layer 170P.

Figure 3K:
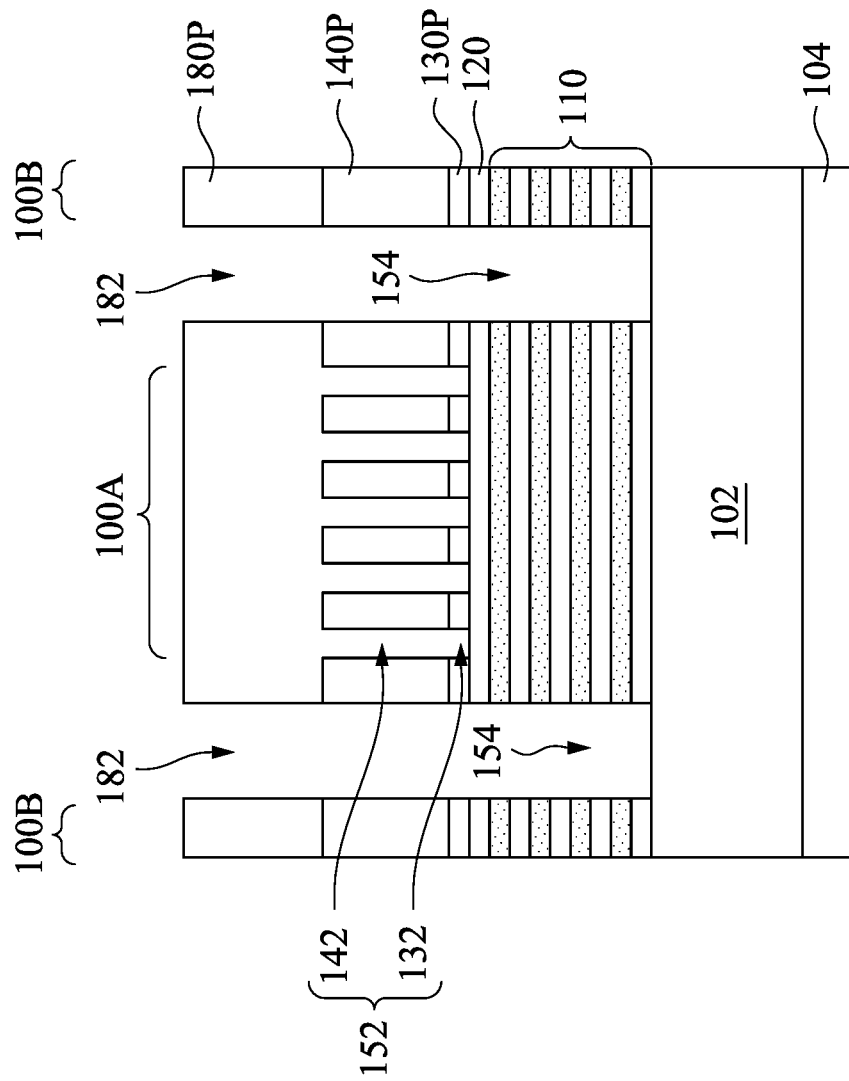

Referring to FIGS. 2 and 3K, the method 200 proceeds to operation 222, in which the patterned absorber layer 140P, the patterned buffer layer 130P if present, the capping layer 120, and the reflective multilayer stack 110 are etched using the patterned photoresist layer 180P as an etch mask to form trenches 154 in the peripheral region 100B of the substrate 102, in accordance with some embodiments. FIG. 3K is a cross-sectional view of the structure of FIG. 3J after etching the patterned absorber layer 140P, the patterned buffer layer 130P if present, the capping layer 120, and the reflective multilayer stack 110, to form the trenches 154 in the peripheral region 100B of the substrate 102, in accordance with some embodiments.

Referring to FIG. 3J, the trenches 154 extend through the patterned absorber layer 140P, the patterned buffer layer 130P if present, the capping layer 120, and the reflective multilayer stack 110 to expose the surface of the substrate 102. The trenches 154 surround the pattern region 100A of the EUV mask 100, separating the pattern region 100A from the peripheral region 100B.

In some embodiments, the patterned absorber layer 140P, the patterned buffer layer 130P, the capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the patterned buffer layer 130P, the capping layer 120, and the reflective multilayer stack 110, selective to the material providing the substrate 102. In some embodiments, the patterned absorber layer 140P, the patterned buffer layer 130P, the capping layer 120, and the reflective multilayer stack 110 are etched using multiple distinct anisotropic etching processes. Each anisotropic etch can be a dry etch such as, for example, RIE, a wet etch, or a combination thereof.

Figure 3L:
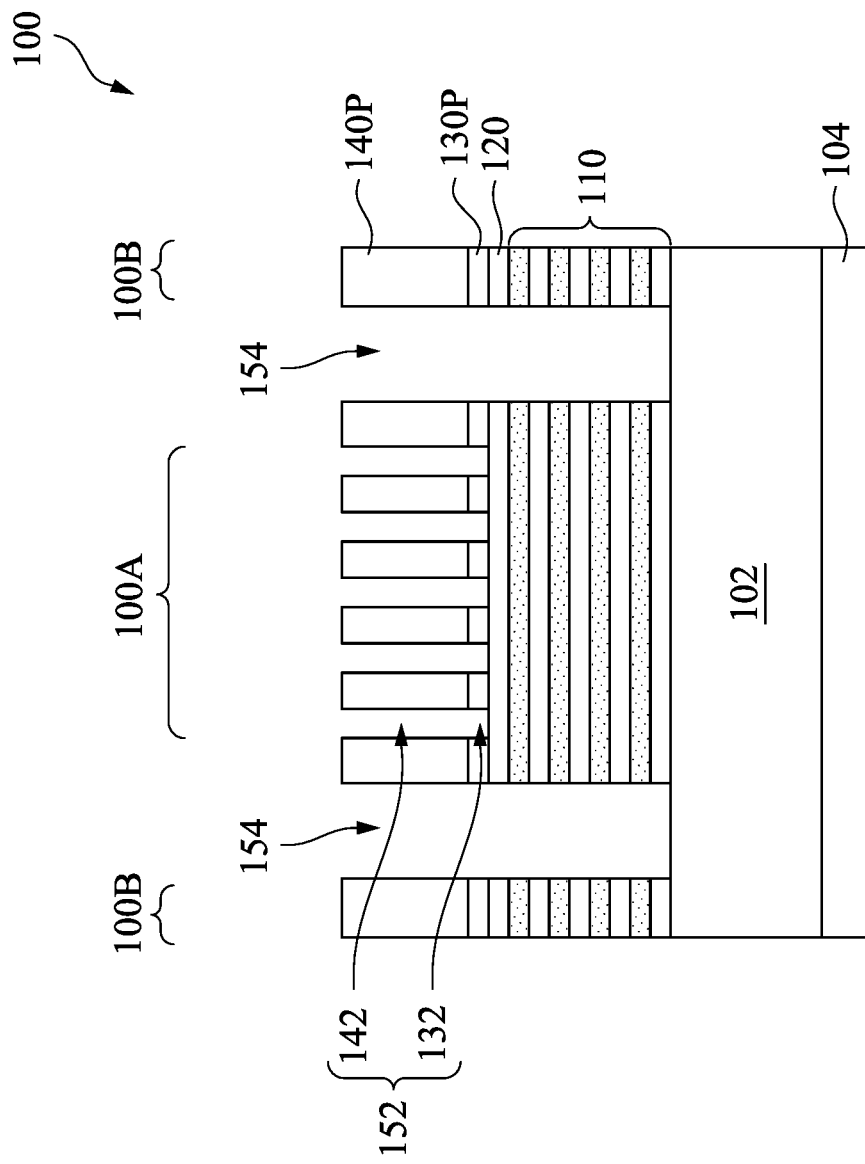

Referring to FIGS. 2 and 3L, the method 200 proceeds to operation 224, in which the patterned photoresist layer 180P is removed, in accordance with some embodiments. FIG. 3L is a cross-sectional view of the structure of FIG. 3K after removing the patterned photoresist layer 180P, in accordance with some embodiments.

Referring to FIG. 3L, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P and the openings 132 in the patterned buffer layer 130P re-exposes the surfaces of the capping layer 120 in the pattern region 100A.

An EUV mask 100 is thus formed. The EUV mask 100 includes a substrate 102, a reflective multilayer stack 110 over a front surface of the substrate 102, a capping layer 120 over the reflective multilayer stack 110, a patterned buffer layer 130P over the capping layer 120, and a patterned absorber layer 140P over the patterned buffer layer 130P. The EUV mask 100 further includes a conductive layer 104 over a back surface of the substrate 102 opposite the front surface.

After removal of the patterned photoresist layer 180P, the EUV mask 100 is cleaned to remove any contaminants therefrom. In some embodiments, the EUV mask 100 is cleaned by submerging the EUV mask 100 into an ammonium hydroxide ($NH_4OH$) solution. In some embodiments, the EUV mask 100 is cleaned by submerging the EUV mask 100 into a diluted hydrofluoric acid (HF) solution.

The EUV mask 100 is subsequently radiated with, for example, a UV light with a wavelength of 193 nm, for inspection of any defects in the patterned region 100A. The foreign matters may be detected from diffusely reflected light. If defects are detected, the EUV mask 100 is further cleaned using suitable cleaning processes.

Figure 4:
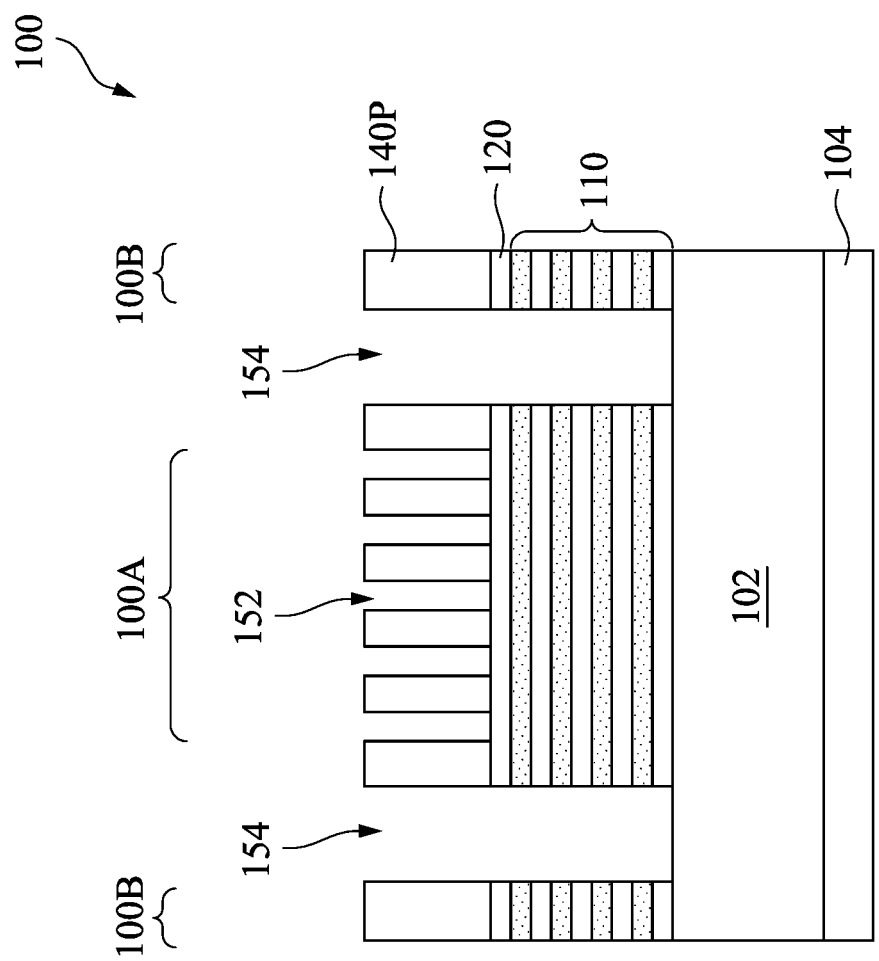
FIG. 4 is a cross-sectional view of an extreme ultraviolet (EUV) mask, in accordance with a second embodiment.

FIG. 4 is a cross-sectional view of an EUV mask 400, in accordance with a second embodiment of the present disclosure. Referring to FIG. 4, the EUV mask 400 includes a substrate 102, a reflective multilayer stack 110 over a front surface of the substrate 102, a capping layer 120 over the reflective multilayer stack 110, and a patterned absorber layer 140P over the capping layer 120. The EUV mask 400 further includes a conductive layer 104 over a back surface of the substrate 102 opposite the front surface. In comparison with the EUV mask 100 of FIG. 1, the patterned buffer layer 130P is omitted in the EUV mask 400. Accordingly, in the EUV mask 100, the patterned absorber layer 140P is in direct contact with the capping layer 120.

Figure 5:
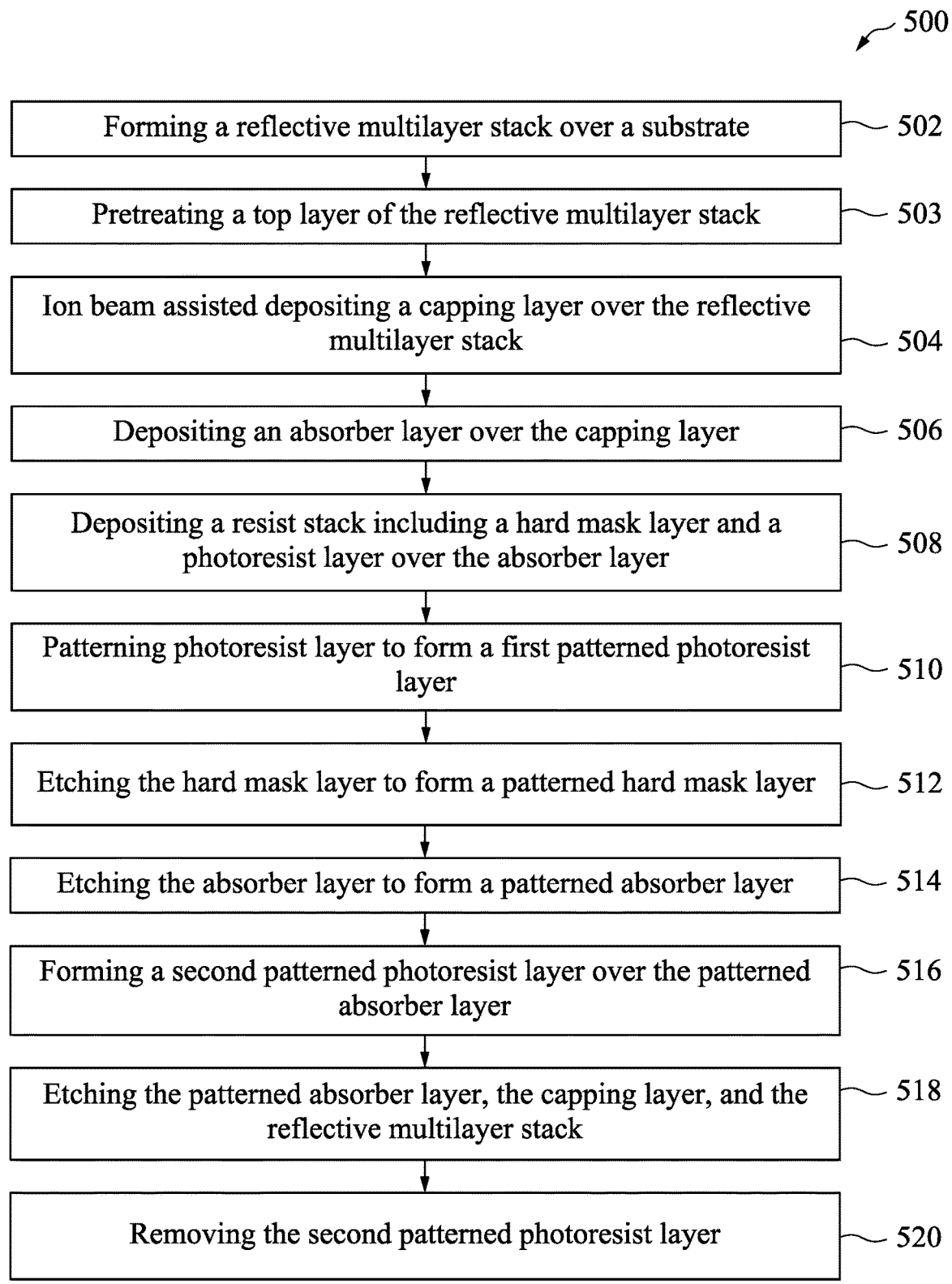
FIG. 5 is a flowchart of a method for fabricating the EUV mask of FIG. 4, in accordance with some embodiments.

FIG. 5 is a flowchart of a method 500 for fabricating an EUV mask, for example, EUV mask 400, in accordance with some embodiments. FIG. 6A through FIG. 6J are cross-sectional views of the EUV mask 400 at various stages of the fabrication process, in accordance with some embodiments. The method 500 is discussed in detail below, with reference to the EUV mask 400. In some embodiments, additional operations are performed before, during, and/or after the method 500, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 6A:
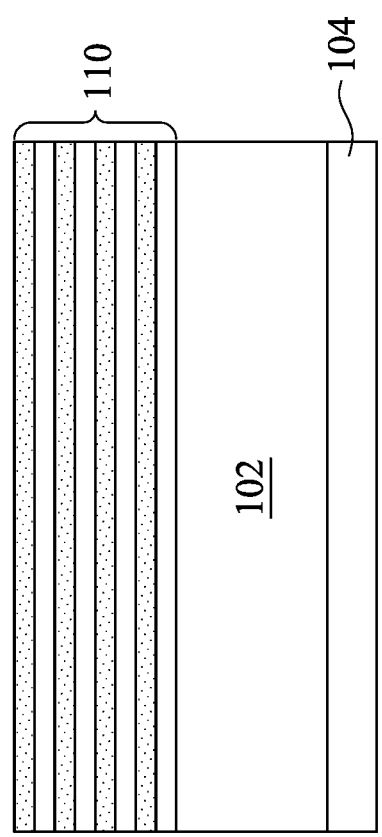
FIGS. 6A-6J are cross-sectional views of an EUV mask at various stages of the fabrication process of FIG. 5, in accordance with some embodiments.

Referring to FIGS. 5 and 6A, the method 500 includes operation 502, in which a reflective multilayer stack 110 is formed over a substrate 102, in accordance with some embodiments. FIG. 6A is a cross-sectional view of an initial structure of an EUV mask 400 after forming the reflective multilayer stack 110 over the substrate 102, in accordance with some embodiments. The materials and formation processes for the reflective multilayer stack 110 are similar to those described above in FIG. 3A, and hence are not described in detail herein.

Referring to FIGS. 5 and 3A the method 500 includes operation 503, in which a top layer of the reflective multilayer stack 110 is pretreated in accordance with the description of step 203 with respect to FIGS. 2 and 3A. That description is applicable to operation 503 of method 500 and is not reproduced here.

Figure 6B:
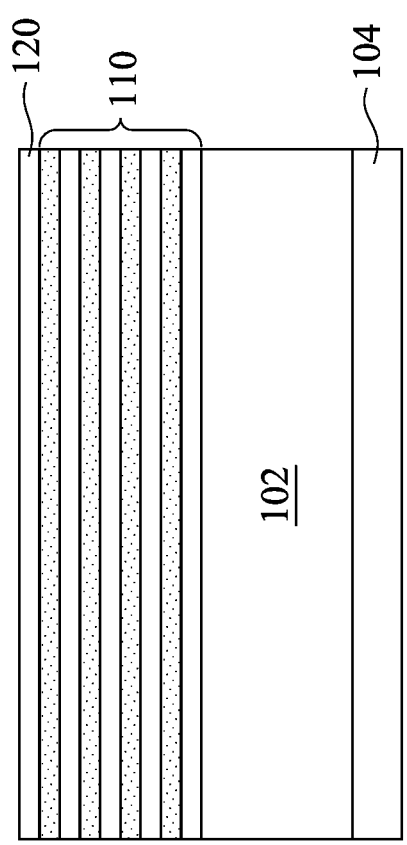

Referring to FIGS. 5, 3B, 7 and 8, the method 500 includes operation 504, in which a capping layer 120 is formed over the reflective multilayer stack 110 via an ion assisted deposition process, such as the ion assisted ion beam deposition or the ion assisted sputtering deposition described above with reference to FIGS. 2, 3B, 7 and 8. The description of the ion assisted ion beam deposition process and the description of the ion assisted sputtering process with reference to FIGS. 2, 3B, 7 and 8 is also applicable to operation 504 and is not reproduced here. FIG. 6B is a cross-sectional view of the structure of FIG. 6A after depositing the capping layer 120 over the reflective multilayer stack 110, in accordance with some embodiments.

Figure 6C:
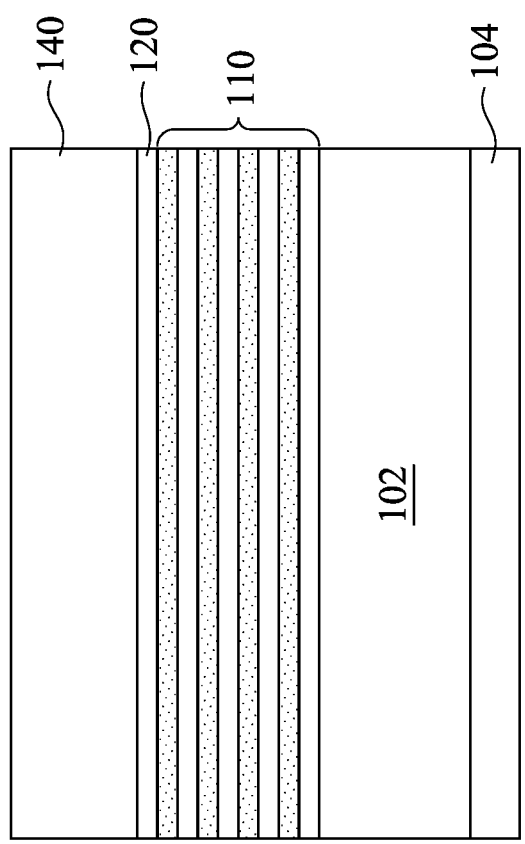

Referring to FIGS. 5 and 6C, the method 500 proceeds to operation 506, in which an absorber layer 140 is deposited over the capping layer 120, in accordance with various embodiments. FIG. 6C is a cross-sectional view of the structure of FIG. 6B after depositing the absorber layer 140 over the capping layer 120, in accordance with some embodiments. The materials and formation processes for the absorber layer 140 are similar to those described above in FIG. 3D, and hence are not described in detail herein.

Figure 6D:
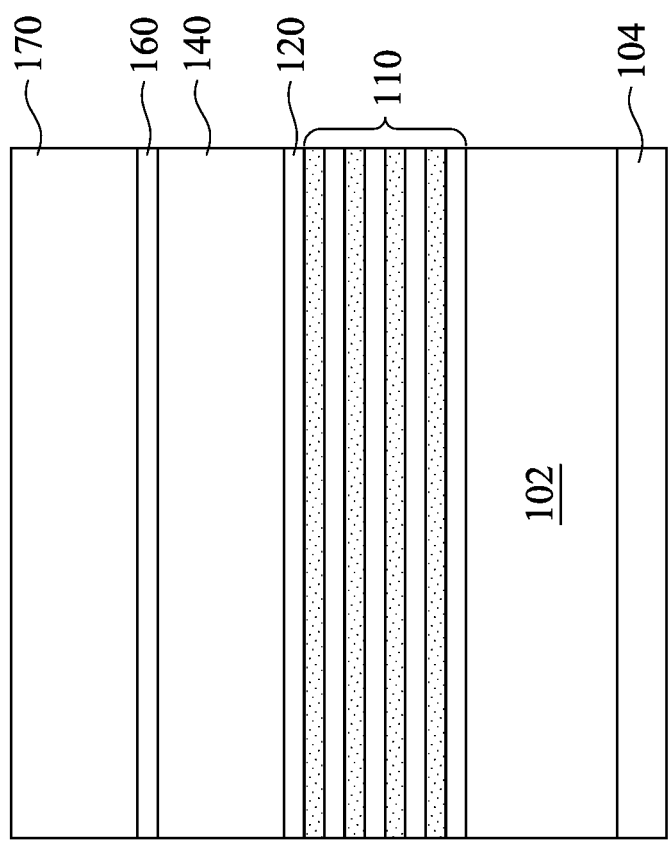

Referring to FIGS. 5 and 6D, the method 500 proceeds to operation 508, in which a resist stack including a hard mask layer 160 and a photoresist layer 170 is deposited over the absorber layer 140, in accordance with some embodiments. FIG. 6D is a cross-sectional view of the structure of FIG. 6C after sequentially depositing the hard mask layer 160 and the photoresist layer 170 over the absorber layer 140, in accordance with some embodiments. Materials and formation processes for respective hard mask layer 160 and photoresist layer 170 are similar to those described in FIG. 3E, and hence are not described in detail herein.

Figure 6E:
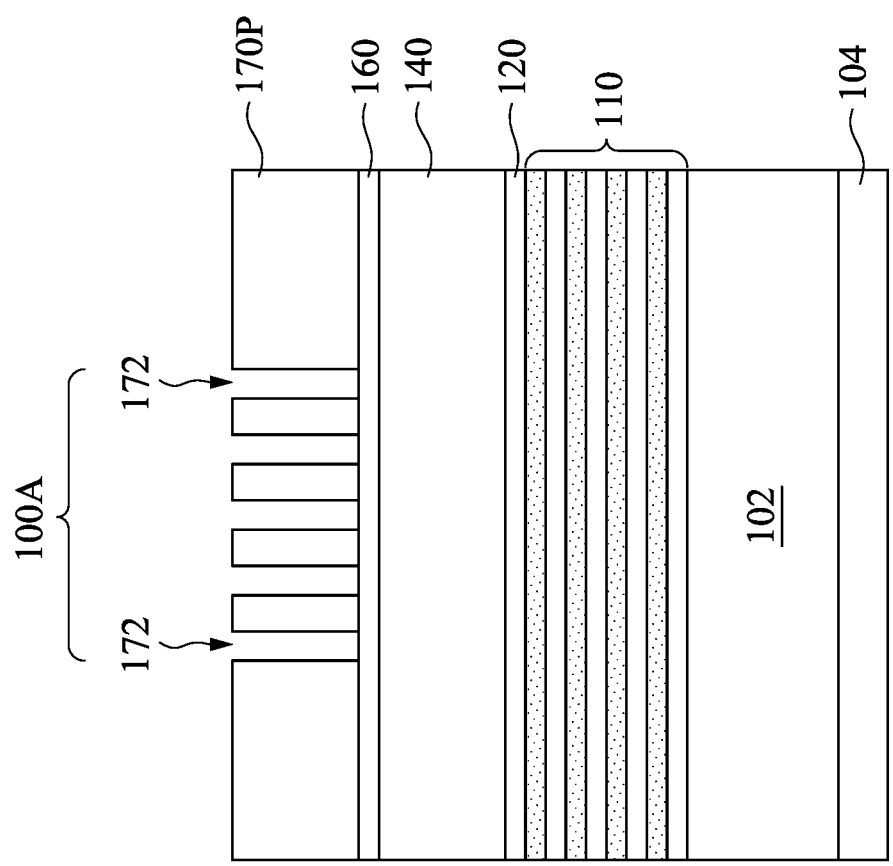

Referring to FIGS. 5 and 6E, the method 500 proceeds to operation 510, in which the photoresist layer 170 is lithographically patterned to form a patterned photoresist layer 170P, in accordance with some embodiments. FIG. 6E is a cross-sectional view of the structure of FIG. 6D after lithographically patterning the photoresist layer 170 to form the patterned photoresist layer 170P, in accordance with some embodiments. Etching processes for the photoresist layer 170 are similar to those described in FIG. 3F, and hence are not described in detail herein.

Figure 6F:
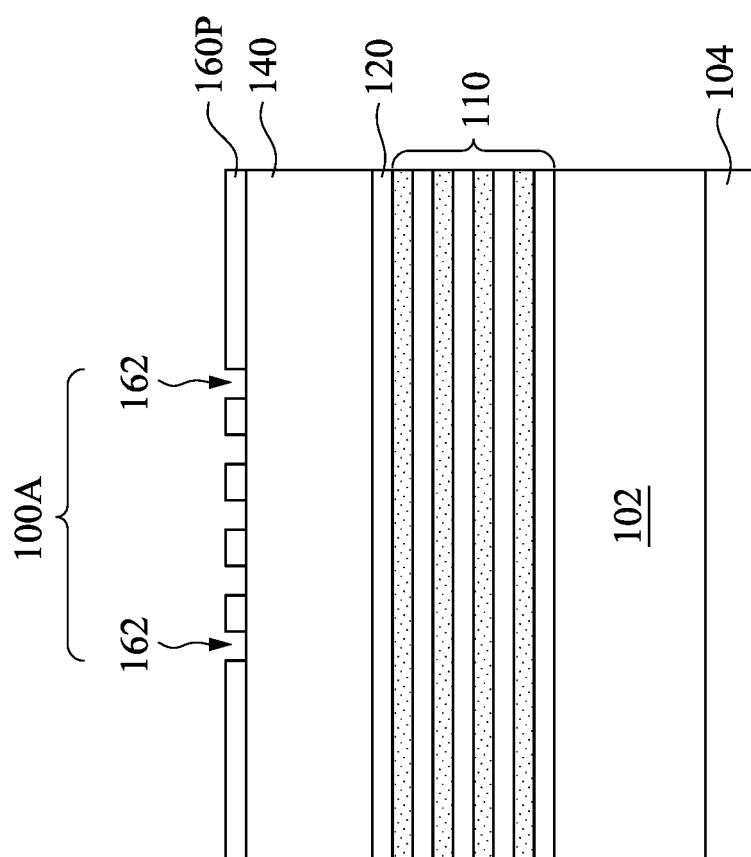

Referring to FIGS. 5 and 6F, the method 500 proceeds to operation 512, in which the hard mask layer 160 is etched using the patterned photoresist layer 170P as an etch mask to form a patterned hard mask layer 160P, in accordance with some embodiments. FIG. 6F is a cross-sectional view of the structure of FIG. 6E after etching the hard mask layer 160 to form the patterned hard mask layer 160P, in accordance with some embodiments. Etching processes for the hard mask layer 160 are similar to those described in FIG. 3G, and hence are not described in detail herein.

Figure 6G:
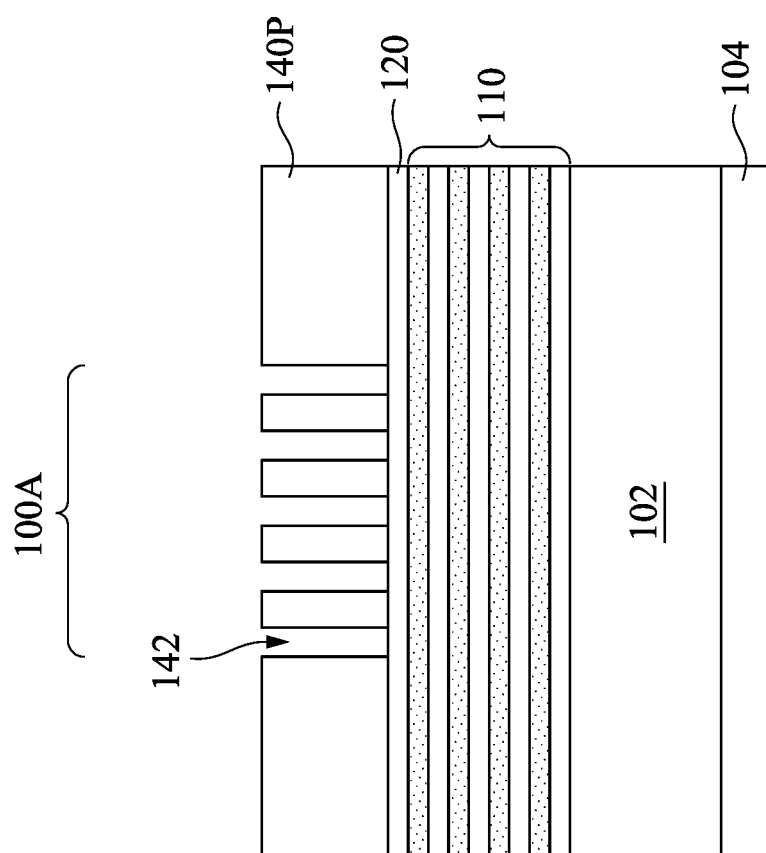

Referring to FIGS. 5 and 6G, the method 500 proceeds to operation 514, in which the absorber layer 140 is etched using the patterned hard mask layer 160P as an etch mask to form a patterned absorber layer 140P, in accordance with some embodiments. FIG. 6G is a cross-sectional view of the structure of FIG. 6F after etching the absorber layer 140 to form the patterned absorber layer 140P, in accordance with some embodiments. Etching processes for the absorber layer 140 are similar to those described in FIG. 3G, and hence are not described in detail herein. The patterned absorber layer 140P includes a plurality of openings 142 that expose the underlying capping layer 120.

After etching the absorber layer 140, the patterned hard mask layer 160P is removed from the surfaces of the patterned absorber layer 140P, for example, using oxygen plasma or a wet etch.

Figure 6H:
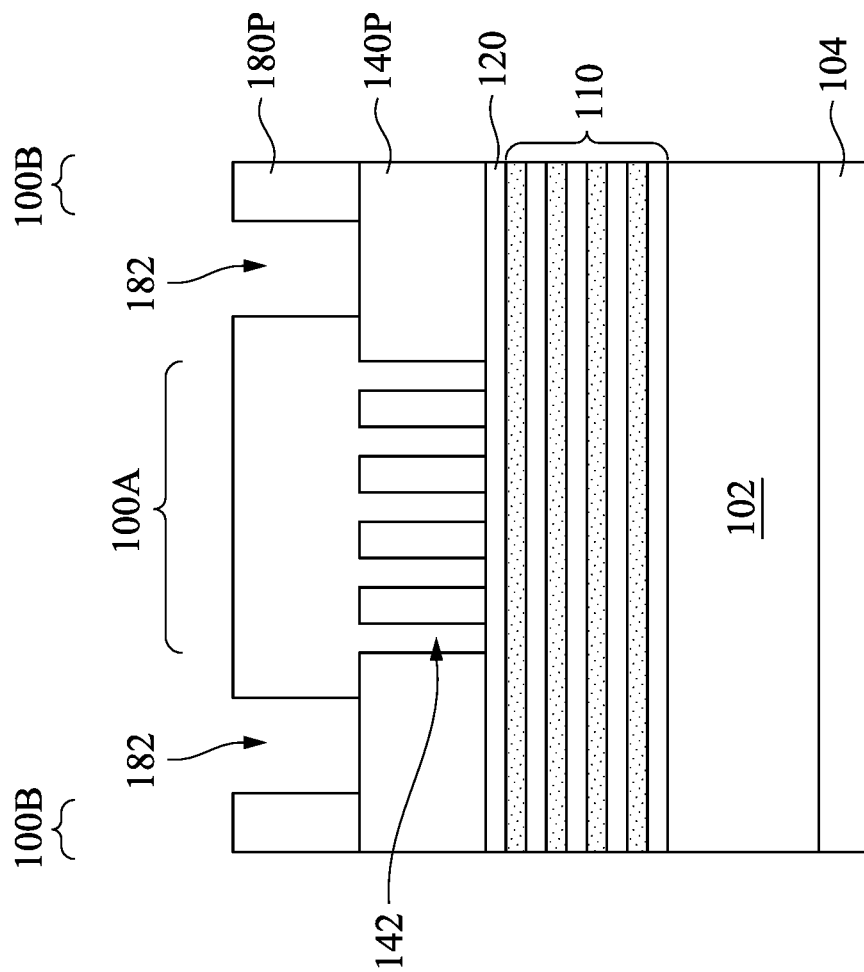

Referring to FIGS. 5 and 6H, the method 500 proceeds to operation 516, in which a patterned photoresist layer 180P comprising a pattern of openings 182 is formed over the patterned absorber layer 140P, in accordance with some embodiments. FIG. 6H is a cross-sectional view of the structure of FIG. 6G after forming the patterned photoresist layer 180P comprising openings 182 over the patterned absorber layer 140P, in accordance with some embodiments. Materials and fabrication processes for the patterned photoresist layer 180P are similar to those described in FIG. 3J, and hence are not described in detail herein.

Figure 6I:
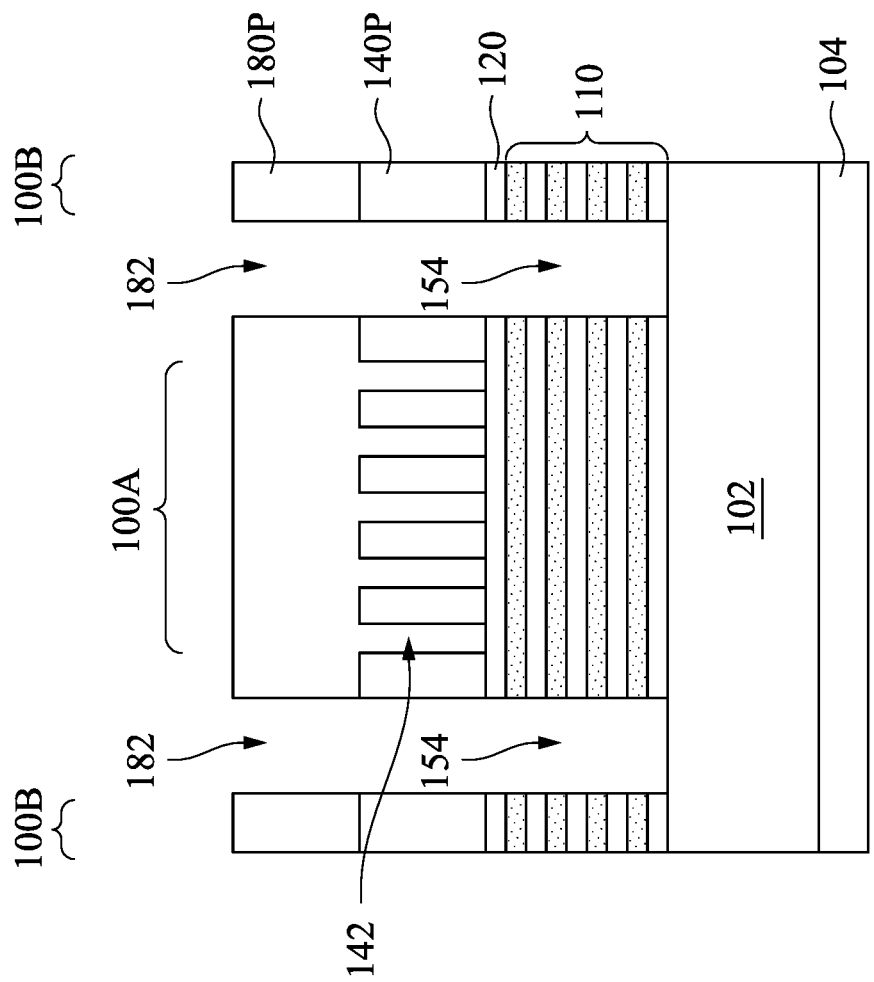

Referring to FIGS. 5 and 6I, the method 500 proceeds to operation 518, in which the patterned absorber layer 140P, the capping layer 120, and the reflective multilayer stack 110 are etched using the patterned photoresist layer 180P as an etch mask to form trenches 154 in the peripheral region 100B of the substrate 102, in accordance with some embodiments. FIG. 6I is a cross-sectional view of the structure of FIG. 6H after etching the patterned absorber layer 140P, the capping layer 120, and the reflective multilayer stack 110, to form the trenches 154 in the peripheral region 100B of the substrate 102, in accordance with some embodiments.

Referring to FIG. 6I, the trenches 154 extend through the patterned absorber layer 140P, the capping layer 120, and the reflective multilayer stack 110 to expose the surface of the substrate 102. The trenches 154 surround the pattern region 100A of the EUV mask 100, separating the pattern region 100A from the peripheral region 100B.

In some embodiments, the patterned absorber layer 140P, the capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the capping layer 120, and the reflective multilayer stack 110, selective to the material providing the substrate 102. In some embodiments, the patterned absorber layer 140P, the capping layer 120, and the reflective multilayer stack 110 are etched using multiple distinct anisotropic etching processes. Each anisotropic etch can be a dry etch such as, for example, RIE, a wet etch, or a combination thereof.

Figure 6J:
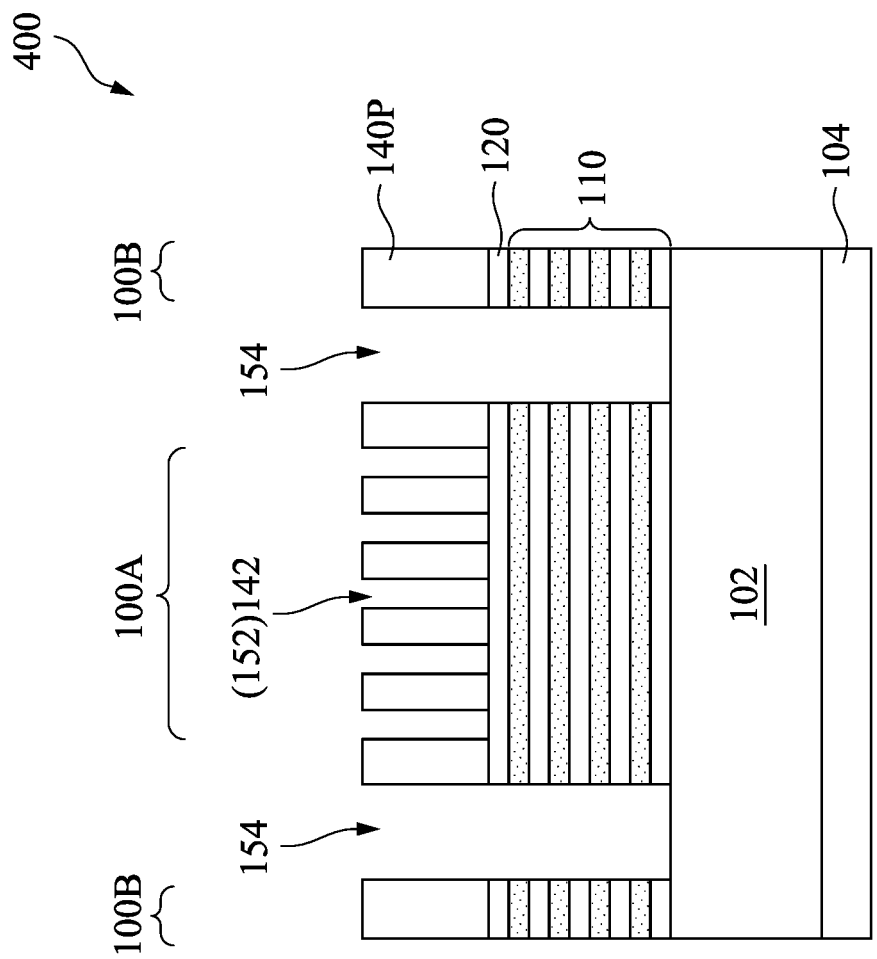

Referring to FIGS. 5 and 6J, the method 500 proceeds to operation 520, in which the patterned photoresist layer 180P is removed, in accordance with some embodiments. FIG. 6J is a cross-sectional view of the structure of FIG. 6I after removing the patterned photoresist layer 180P, in accordance with some embodiments.

Referring to FIG. 6J, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P re-exposes the surfaces of the capping layer 120 in the pattern region 100A. The openings 142 in the patterned absorber layer 140P define the pattern of openings 152 in the EUV mask 400.

An EUV mask 400 is thus formed. The EUV mask 400 includes a substrate 102, a reflective multilayer stack 110 over a front surface of the substrate 102, a capping layer 120 over the reflective multilayer stack 110, and a patterned absorber layer 140P over the capping layer 120. The EUV mask 400 further includes a conductive layer 104 over a back surface of the substrate 102 opposite the front surface.

After removal of the patterned photoresist layer 180P, the EUV mask 400 is cleaned to remove any contaminants therefrom. In some embodiments, the EUV mask 400 is cleaned by submerging the EUV mask 400 into an ammonium hydroxide ($NH_4OH$) solution. In some embodiments, the EUV mask 400 is cleaned by submerging the EUV mask 400 into a diluted hydrofluoric acid (HF) solution.

The EUV mask 400 is subsequently radiated with, for example, a UV light with a wavelength of 193 nm, for inspection of any defects in the patterned region 100A. The foreign matters may be detected from diffusely reflected light. If defects are detected, the EUV mask 400 is further cleaned using suitable cleaning processes.

One aspect of this description relates to an EUV mask. The EUV mask includes a substrate, a pretreated reflective multilayer stack on the substrate, and an amorphous capping layer formed by an ion-assisted ion beam deposition or an ion-assisted sputtering process on the pretreated reflective multilayer stack. The capping layer has an amorphous structure, making it stronger than capping layers having crystalline or polycrystalline structure. This increased strength makes the capping layer less susceptible to oxygen passing through the capping layer and oxidizing layers of the underlying multistack. When such oxidation occurs, cracking of the layers of the multistack or the capping layer can occur, negatively impacting the reflectivity of the mask and its durability.

Another aspect of this description relates to a method of forming an EUV mask. The method includes forming a reflective multilayer stack on a substrate, plasma treating a top layer of the reflective multilayer stack, depositing a capping layer on the reflective plasma treated reflective multilayer stack by an ion assisted ion beam deposition or an ion assisted sputtering, depositing an absorber layer on the capping layer, forming a patterned hard mask layer on the absorber layer, and etching the absorber layer to form a plurality of openings exposing a surface of the capping layer using the patterned hard mask as an etch mask. The capping layer has an amorphous structure, making it stronger than capping layers having crystalline or polycrystalline structure. This increased strength makes the capping layer less susceptible to oxygen passing through the capping layer and oxidizing layers of the underlying multistack. When such oxidation occurs, cracking of the layers of the multistack or the capping layer can occur, negatively impacting the reflectivity of the mask and its durability.

Still another aspect of this description relates to a method of forming an EUV mask. The method includes forming a reflective multilayer stack on a substrate. A top layer of the reflective multilayer stack is exposed to a treatment gas, such as an oxygen containing gas or a nitrogen containing gas. An amorphous capping layer is then deposited on the treated reflective multilayer stack using an ion assisted ion beam deposition or an ion assisted sputtering. An absorber layer is deposited on the capping layer and a hard mask is formed on the absorber layer. The hard mask is etched to form a patterned hard mask layer. The absorber layer is then etched to form a plurality of openings therein using the patterned hard mask layer as an etch mask. Portions of the capping layer are exposed through the plurality of openings. The capping layer has an amorphous structure, making it stronger than capping layers having crystalline or polycrystalline structure. This increased strength makes the capping layer less susceptible to oxygen passing through the capping layer and oxidizing layers of the underlying multistack. When such oxidation occurs, cracking of the layers of the multistack or the capping layer can occur, negatively impacting the reflectivity of the mask and its durability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) mask, comprising:
   a substrate;
   a pretreated multilayer stack on the substrate; and
   an amorphous capping layer on the pretreated multilayer stack.

2. The EUV mask of claim 1, wherein the pretreated multilayer stack is plasma pretreated.

3. The EUV mask of claim 1, wherein the pretreated multilayer stack is pretreated by exposure to pretreatment gas.

4. The EUV mask of claim 3, wherein the pretreatment gas includes nitrogen, oxygen or a combination of nitrogen and oxygen.

5. The EUV mask of claim 1, wherein the amorphous capping layer is formed by an ion-assisted deposition of a capping layer material.

6. The EUV mask of claim 1, further comprising a diffusion prevention layer between the pretreated multilayer stack and the amorphous capping layer.

7. The EUV mask of claim 1, wherein the pretreated multilayer stack includes an oxidized silicon top layer.

8. The EUV mask of claim 1, wherein the pretreated multilayer stack includes a reflective multilayer stack after exposure to a nitrogen-containing gas.

9. The EUV mask of claim 1, further comprising a patterned absorber layer in contact with the amorphous capping layer.

10. A method of forming an extreme ultraviolet (EUV) mask, comprising:
    forming a multilayer stack on a substrate;
    treating a top layer of the multilayer stack;
    depositing a capping layer on the treated top layer of the multilayer stack;
    depositing an absorber layer on the capping layer;
    forming a patterned hard mask layer on the absorber layer; and
    etching the absorber layer to form a plurality of openings therein using the patterned hard mask layer as an etch mask, the plurality of openings exposing a surface of the capping layer.

11. The method of claim 10, wherein the depositing the capping layer includes depositing a layer of an amorphous capping layer material.

12. The method of claim 10, wherein the depositing the capping layer on the treated top layer of the multilayer stack is carried out at a temperature below about 150° C.

13. The method of claim 10, wherein the depositing the capping layer on the treated top layer of the multilayer stack is carried out at a voltage that is less than 50% of the voltage utilized by the ion beam deposition.

14. The method of claim 10, wherein the treating utilizes an argon-containing gas.

15. The method of claim 10, further comprising altering a surface of the capping layer prior to depositing the absorber layer on the capping layer, the altering including one or more of plasma treating the surface of the capping layer, exposing the surface of the capping layer to an oxygen-containing gas or exposing the surface of the capping layer to a nitrogen-containing gas.

16. A method of forming an extreme ultraviolet (EUV) mask, comprising:
    forming a multilayer stack on a substrate;
    exposing a top layer of the multilayer stack to a treatment gas;
    forming an amorphous capping layer on the top layer of the multilayer stack exposed to the treatment gas;
    depositing an absorber layer over the amorphous capping layer;
    forming a hard mask layer on the absorber layer;

etching the hard mask layer to form a patterned hard mask layer; and etching the absorber layer to form a plurality of openings therein using the patterned hard mask layer as an etch mask, the plurality of openings exposing a surface of the amorphous capping layer.

17. The method of claim 16, wherein the exposing the top layer of the multilayer stack to a treatment gas includes exposing the top layer of the multilayer stack to an oxygen-containing gas or a nitrogen-containing gas.

18. The method of claim 16, wherein the amorphous capping layer comprises ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn), technetium (Tc), titanium (Ti) or alloys thereof.

19. The method of claim 16, further comprising oxidizing a portion of the top layer of the multilayer stack.

20. The method of claim 16, wherein the exposing a top layer of the multilayer stack to a treatment gas is carried out at a temperature below about 150° C.

* * * * *